(12) United States Patent
Scarbrough et al.

(10) Patent No.: US 12,255,143 B2
(45) Date of Patent: Mar. 18, 2025

(54) MICROELECTRONIC DEVICES INCLUDING COMPOSITE PAD STRUCTURES ON STAIRCASE STRUCTURES, AND RELATED METHODS, MEMORY DEVICES, AND ELECTRONIC SYSTEMS

(71) Applicant: Micron Technology, Inc., Boise, ID (US)

(72) Inventors: Alyssa N. Scarbrough, Boise, ID (US); Jordan D. Greenlee, Boise, ID (US); John D. Hopkins, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 267 days.

(21) Appl. No.: 17/187,481

(22) Filed: Feb. 26, 2021

(65) Prior Publication Data

US 2022/0278051 A1   Sep. 1, 2022

(51) Int. Cl.
*H01L 23/532* (2006.01)
*H01L 23/528* (2006.01)
(Continued)

(52) U.S. Cl.
CPC .... *H01L 23/53209* (2013.01); *H01L 23/5283* (2013.01); *H01L 23/53295* (2013.01);
(Continued)

(58) Field of Classification Search
CPC ........... H01L 23/53209; H01L 23/5283; H01L 23/53295; H01L 21/76805; H10B 41/27;
(Continued)

(56) References Cited

U.S. PATENT DOCUMENTS 9,515,023 B2 * 12/2016 Tobitsuka .............. H10B 43/20
9,691,782 B1 *  6/2017 Hwang .................. H10B 43/40
(Continued)

OTHER PUBLICATIONS

International Search Report for International Application No. PCT/US2022/014731, mailed Oct. 13. 2022, 4 pages.
(Continued)

*Primary Examiner* — Kimberly N Rizkallah
*Assistant Examiner* — Pratiksha Jayant Lohakare
(74) *Attorney, Agent, or Firm* — TraskBritt

(57) ABSTRACT

A microelectronic device includes a stack structure, a staircase structure, composite pad structures, and conductive contact structures. The stack structure includes vertically alternating conductive structures and insulative structures arranged in tiers. Each of the tiers individually includes one of the conductive structures and one of the insulative structures. The staircase structure has steps including edges of at least some of the tiers of the stack structure. The composite pad structures are on the steps of the staircase structure. Each of the composite pad structures includes a lower pad structure, and an upper pad structure overlying the lower pad structure and having a different material composition than the lower pad structure. The conductive contact structures extend through the composite pad structures and to the conductive structures of the stack structure. Memory devices, electronic systems, and methods of forming microelectronic devices are also described.

25 Claims, 12 Drawing Sheets

(51) Int. Cl.
  *H10B 41/27* (2023.01)
  *H10B 41/35* (2023.01)
  *H10B 41/40* (2023.01)
  *H10B 43/27* (2023.01)
  *H10B 43/35* (2023.01)
  *H10B 43/40* (2023.01)

(52) U.S. Cl.
  CPC ............. *H10B 41/27* (2023.02); *H10B 41/35* (2023.02); *H10B 41/40* (2023.02); *H10B 43/27* (2023.02); *H10B 43/35* (2023.02); *H10B 43/40* (2023.02)

(58) Field of Classification Search
  CPC ........ H10B 41/35; H10B 41/40; H10B 43/27; H10B 43/35; H10B 43/40; H10B 43/50
  USPC .......................................................... 257/324
  See application file for complete search history.

(56) References Cited

U.S. PATENT DOCUMENTS

| | | | |
|---|---|---|---|
| 9,905,514 B2* | 2/2018 | Tanzawa | H10B 43/27 |
| 10,580,795 B1* | 3/2020 | Luo | H01L 23/528 |
| 10,672,711 B2* | 6/2020 | Zhu | H01L 21/76832 |
| 11,088,166 B2* | 8/2021 | Oh | H10B 41/41 |
| 11,315,877 B2* | 4/2022 | Greenlee | H01L 21/76885 |
| 2005/0184329 A1* | 8/2005 | Prall | G11C 16/04 438/257 |
| 2015/0270165 A1* | 9/2015 | Hyun | H10B 43/35 257/329 |
| 2017/0179025 A1* | 6/2017 | Yun | H10B 43/10 |
| 2017/0294383 A1* | 10/2017 | Tanzawa | H10B 43/27 |
| 2018/0083035 A1* | 3/2018 | Oh | H10B 43/50 |
| 2019/0079128 A1* | 3/2019 | Licausi | G01R 31/2601 |
| 2019/0081072 A1 | 3/2019 | Chun et al. | |
| 2019/0081105 A1* | 3/2019 | Park | H01L 27/0688 |
| 2019/0240555 A1 | 8/2019 | Bognanno | |
| 2019/0273089 A1 | 9/2019 | Yamamoto | |
| 2019/0273090 A1* | 9/2019 | Fukuzumi | H10B 43/27 |
| 2019/0363014 A1 | 11/2019 | Lee et al. | |
| 2020/0227481 A1* | 7/2020 | Jeong | H10N 70/8616 |
| 2020/0286905 A1* | 9/2020 | Kai | H10B 43/27 |
| 2021/0126009 A1* | 4/2021 | Luo | H10B 41/35 |
| 2021/0183771 A1* | 6/2021 | Lee | H01L 23/5283 |
| 2021/0233928 A1* | 7/2021 | Lee | G11C 8/14 |
| 2021/0408041 A1* | 12/2021 | Oh | H10B 43/27 |

OTHER PUBLICATIONS

International Written Opinion for International Application No. PCT/US2022/014731, mailed Oct. 13, 2022, 5 pages.

* cited by examiner

MICROELECTRONIC DEVICES INCLUDING COMPOSITE PAD STRUCTURES ON STAIRCASE STRUCTURES, AND RELATED METHODS, MEMORY DEVICES, AND ELECTRONIC SYSTEMS

TECHNICAL FIELD

The disclosure, in various embodiments, relates generally to the field of microelectronic device design and fabrication. More specifically, the disclosure relates to methods of forming microelectronic devices, and to related microelectronic devices, memory devices, and electronic systems.

BACKGROUND

A continuing goal of the microelectronics industry has been to increase the memory density (e.g., the number of memory cells per memory die) of memory devices, such as non-volatile memory devices (e.g., NAND Flash memory devices). One way of increasing memory density in non-volatile memory devices is to utilize vertical memory array (also referred to as a "three-dimensional (3D) memory array") architectures. A conventional vertical memory array includes vertical memory strings extending through openings in one or more stack structures including tiers of conductive structures and dielectric materials. Each vertical memory string may include at least one select device coupled in series to a serial combination of vertically-stacked memory cells. Such a configuration permits a greater number of switching devices (e.g., transistors) to be located in a unit of die area (i.e., length and width of active surface consumed) by building the array upwards (e.g., vertically) on a die, as compared to structures with conventional planar (e.g., two-dimensional) arrangements of transistors.

Vertical memory array architectures generally include electrical connections between the conductive structures of the tiers of the stack structure(s) of the memory device and access lines (e.g., word lines) so that the memory cells of the vertical memory array can be uniquely selected for writing, reading, or erasing operations. One method of forming such an electrical connection includes forming so-called "staircase" (or "stair step") structures at edges (e.g., horizontal ends) of the tiers of the stack structure(s) of the memory device. The staircase structure includes individual "steps" defining contact regions of the conductive structures, upon which conductive contact structures can be positioned to provide electrical access to the conductive structures.

Unfortunately, as feature packing densities have increased and margins for formation errors have decreased, conventional methods of forming memory devices (e.g., NAND Flash memory devices) have resulted in undesirable damage that can diminish desired memory device performance, reliability, and durability. For example, conventional processes of forming conductive contact structures on the steps of a staircase structure within a stack structure may punch through conductive structures of the stack structure, resulting in undesirable current leaks and short circuits. Conventional methods of mitigating such punch through include forming dielectric pad structures (e.g., so called "mesa nitride" structures) on sacrificial insulative structures (e.g., dielectric nitride structures) at steps of a staircase structure within a preliminary stack structure prior to subjecting the preliminary stack structure to so called "replacement gate" or "gate last" processing to replace one or more portions of the sacrificial insulative structures with conductive structures and form the stack structure. During the replacement gate processing the dielectric pad structures are also replaced with conductive material to effectively increase thicknesses of portions of the conductive structures at the steps of the staircase structure and mitigate the aforementioned punch through during the subsequent formation of the conductive contact structures. However, the configurations of some staircase structures within a preliminary stack structure may result in undesirable defects (e.g., material inconsistencies, voiding) at the steps of the staircase structure.

DETAILED DESCRIPTION

Figure 1A:
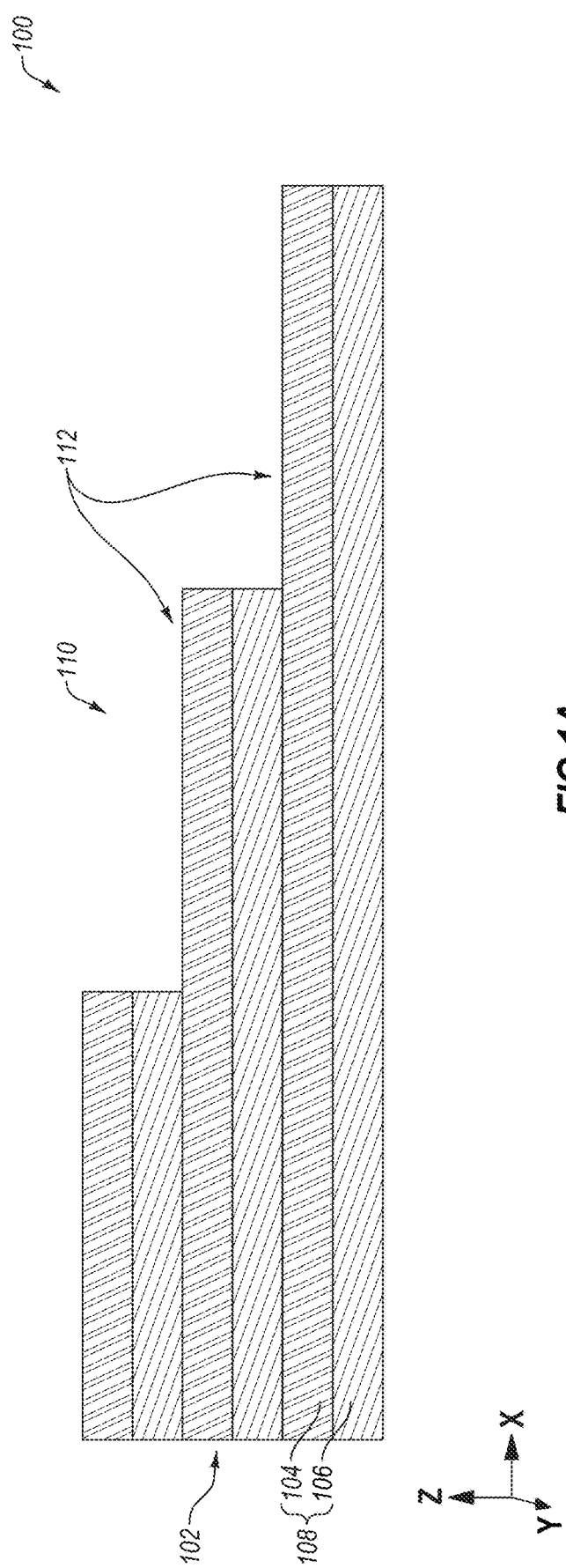
FIGS. 1A through 1J are simplified, partial cross-sectional views illustrating a microelectronic device structure at different processing stages of a method of forming a microelectronic device, in accordance with embodiments of the disclosure.

The following description provides specific details, such as material compositions, shapes, and sizes, in order to provide a thorough description of embodiments of the disclosure. However, a person of ordinary skill in the art would understand that the embodiments of the disclosure may be practiced without employing these specific details. Embodiments of the disclosure may be practiced in conjunction with conventional microelectronic device fabrication techniques employed in the industry. In addition, the description provided below does not form a complete process flow for manufacturing a microelectronic device (e.g., a memory device, such as 3D NAND Flash memory device). The structures described below do not form a complete microelectronic device. Only those process acts and structures necessary to understand the embodiments of the disclosure are described in detail below. Additional acts to form a complete microelectronic device from the structures may be performed by conventional fabrication techniques.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, a "memory device" means and includes microelectronic devices exhibiting memory functionality, but not necessarily limited to memory functionality. Stated another way, and by way of non-limiting example only, the term "memory device" includes not only conventional memory (e.g., conventional volatile memory, such as conventional dynamic random access memory (DRAM); conventional non-volatile memory, such as conventional NAND memory), but also includes an application specific integrated circuit (ASIC) (e.g., a system on a chip (SoC)), a microelectronic device combining logic and memory, and a graphics processing unit (GPU) incorporating memory.

As used herein, the term "configured" refers to a size, shape, material composition, orientation, and arrangement of one or more of at least one structure and at least one apparatus facilitating operation of one or more of the structure and the apparatus in a pre-determined way.

As used herein, the terms "vertical," "longitudinal," "horizontal," and "lateral" are in reference to a major plane of a structure and are not necessarily defined by earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure. With reference to the figures, a "horizontal" or "lateral" direction may be perpendicular to an indicated "Z" axis, and may be parallel to an indicated "X" axis and/or parallel to an indicated "Y" axis; and a "vertical" or "longitudinal" direction may be parallel to an indicated "Z" axis, may be perpendicular to an indicated "X" axis, and may be perpendicular to an indicated "Y" axis.

As used herein, features (e.g., regions, structures, devices) described as "neighboring" one another means and includes features of the disclosed identity (or identities) that are located most proximate (e.g., closest to) one another. Additional features (e.g., additional regions, additional structures, additional devices) not matching the disclosed identity (or identities) of the "neighboring" features may be disposed between the "neighboring" features. Put another way, the "neighboring" features may be positioned directly adjacent one another, such that no other feature intervenes between the "neighboring" features; or the "neighboring" features may be positioned indirectly adjacent one another, such that at least one feature having an identity other than that associated with at least one the "neighboring" features is positioned between the "neighboring" features. Accordingly, features described as "vertically neighboring" one another means and includes features of the disclosed identity (or identities) that are located most vertically proximate (e.g., vertically closest to) one another. Moreover, features described as "horizontally neighboring" one another means and includes features of the disclosed identity (or identities) that are located most horizontally proximate (e.g., horizontally closest to) one another.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the singular forms "a," "an," and "the" are intended to include the plural forms as well, unless the context clearly indicates otherwise.

As used herein, "and/or" includes any and all combinations of one or more of the associated listed items.

As used herein, the phrase "coupled to" refers to structures operatively connected with each other, such as electrically connected through a direct Ohmic connection or through an indirect connection (e.g., by way of another structure).

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, "conductive material" means and includes electrically conductive material such as one or more of a metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), aluminum (Al)), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), and a conductively doped semiconductor material (e.g., conductively-doped polysilicon, conductively-doped germanium (Ge), conductively-doped silicon germanium (SiGe)). In addition, a "conductive structure" means and includes a structure formed of and including conductive material.

As used herein, "insulative material" means and includes electrically insulative material, such one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), and at least one dielectric carboxynitride material (e.g., a silicon carboxynitride ($SiO_xC_zN_y$)). Formulae including one or more of "x", "y", and "z" herein (e.g., $SiO_x$, $AlO_x$, $HfO_x$, $NbO_x$, $TiO_x$, $SiN_y$, $SiO_xN_y$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, an insulative material may comprise one or more stoichiometric compounds and/or one or more non-stoichiometric compounds, and values of "x", "y", and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In addition, an "insulative structure" means and includes a structure formed of and including insulative material.

As used herein, the term "homogeneous" means relative amounts of elements included in a feature (e.g., a material, a structure) do not vary throughout different portions (e.g., different horizontal portions, different vertical portions) of the feature. Conversely, as used herein, the term "heterogeneous" means relative amounts of elements included in a feature (e.g., a material, a structure) vary throughout different portions of the feature. If a feature is heterogeneous, amounts of one or more elements included in the feature may vary stepwise (e.g., change abruptly), or may vary continuously (e.g., change progressively, such as linearly, parabolically) throughout different portions of the feature. The feature may, for example, be formed of and include a stack of at least two different materials.

Unless the context indicates otherwise, the materials described herein may be formed by any suitable technique including, but not limited to, spin coating, blanket coating, chemical vapor deposition (CVD), plasma enhanced CVD (PECVD), atomic layer deposition (ALD), plasma enhanced ALD (PEALD), physical vapor deposition (PVD) (e.g., sputtering), or epitaxial growth. Depending on the specific material to be formed, the technique for depositing or growing the material may be selected by a person of ordinary skill in the art. In addition, unless the context indicates otherwise, removal of materials described herein may be accomplished by any suitable technique including, but not limited to, etching (e.g., dry etching, wet etching, vapor etching), ion milling, abrasive planarization (e.g., chemical-mechanical planarization (CMP)), or other known methods.

FIGS. 1A through 1J are simplified, partial cross-sectional views illustrating a microelectronic device structure at different processing stages of a method of forming a microelectronic device (e.g., a memory device, such as a 3D NAND Flash memory device), in accordance with embodiments of the disclosure. With the description provided below, it will be readily apparent to one of ordinary skill in the art that the methods described herein may be used for forming various devices. In other words, the methods of the disclosure may be used whenever it is desired to form a microelectronic device.

Referring to FIG. 1A, a microelectronic device structure 100 may be formed to include a preliminary stack structure 102. The preliminary stack structure 102 includes a vertically alternating (e.g., in the Z-direction) sequence of insulative material 104 and sacrificial material 106 arranged in tiers 108. Each of the tiers 108 of the preliminary stack structure 102 may include the insulative material 104 vertically neighboring the sacrificial material 106. The preliminary stack structure 102 may be formed to include any desired number of the tiers 108, such as greater than or equal to sixteen (16) tiers 108, greater than or equal to thirty-two (32) tiers 108, greater than or equal to sixty-four (64) tiers 108, greater than or equal to one hundred twenty-eight (128) tiers 108, or greater than or equal to two hundred fifty-six (256) tiers 108.

The insulative material 104 of the tiers 108 of the preliminary stack structure 102 may be formed of and include at least one dielectric material, such one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$), at least one dielectric nitride material (e.g., $SiN_y$), at least one dielectric oxynitride material (e.g., SiOxNy), and at least one dielectric carboxynitride material (e.g., $SiO_xC_zN_y$). In some embodiments, the insulative material 104 of the tiers 108 of the preliminary stack structure 102 is formed of and includes silicon dioxide ($SiO_2$). The insulative material 104 of each of the tiers 108 may be substantially the same (e.g., exhibit substantially the same material composition, material distribution, size, and shape) as the insulative material 104 of each other of the tiers 108, or at least one of the insulative material 104 of at least one of the tiers 108 may be different (e.g., exhibit one or more of a different material composition, a different material distribution, a different size, and a different shape) than the insulative material 104 of at least one other of the tiers 108. In some embodiments, the insulative material 104 of each of the tiers 108 is substantially the same as the insulative material 104 of each other of the tiers 108.

The sacrificial material 106 of the tiers 108 of the preliminary stack structure 102 may be formed of and include at least one material (e.g., at least one dielectric material) that may be selectively removed relative to the insulative material 104 of the tiers 108 of the preliminary stack structure 102. The sacrificial material 106 may be selectively etchable relative to the insulative material 104 during common (e.g., collective, mutual) exposure to a first etchant, and the insulative material 104 may be selectively etchable to the sacrificial material 106 during common exposure to a second, different etchant. As used herein, a material is "selectively etchable" relative to another material if the material exhibits an etch rate that is at least about five times (5×) greater than the etch rate of another material, such as about ten times (10×) greater, about twenty times (20×) greater, or about forty times (40×) greater. A material composition of the sacrificial material 106 is different than a material composition of the insulative material 104. As a non-limiting example, the sacrificial material 106 of the tiers 108 of the preliminary stack structure 102 may comprise an additional dielectric material, such as one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$), at least one dielectric nitride material (e.g., SiN$_y$), at least one dielectric oxynitride material (e.g., SiO$_x$N$_y$), and at least one dielectric carboxynitride material (e.g., SiO$_x$C$_z$N$_y$). In some embodiments, the sacrificial material 106 of the tiers 108 of the preliminary stack structure 102 is formed of and includes a dielectric nitride material, such as SiN$_y$ (e.g., Si$_3$N$_4$). The sacrificial material 106 of each of the tiers 108 may be substantially the same (e.g., exhibit substantially the same material composition, material distribution, size, and shape) as the sacrificial material 106 of each other of the tiers 108, or at least one of the sacrificial material 106 of at least one of the tiers 108 may be different (e.g., exhibit one or more of a different material composition, a different material distribution, a different size, and a different shape) than the sacrificial material 106 of at least one other of the tiers 108. In some embodiments, the sacrificial material 106 of each of the tiers 108 is substantially the same as the sacrificial material 106 of each other of the tiers 108.

With continued reference to FIG. 1A, the microelectronic device structure 100 may further include at least one staircase structure 110 including steps 112 (e.g., contact regions) defined by edges (e.g., horizontal ends) of the tiers 108. The staircase structure 110 may include a desired quantity of the steps 112. As shown in FIG. 1A, in some embodiments, the steps 112 of the staircase structure 110 are arranged in order, such that steps 112 horizontally neighboring one another in the X-direction correspond to tiers 108 of the preliminary stack structure 102 vertically neighboring one another in the Z-direction. In additional embodiments, the steps 112 of the staircase structure 110 are arranged out of order, such that at least some steps 112 of the staircase structure 110 horizontally neighboring one another in the X-direction correspond to tiers 108 of preliminary stack structure 102 not vertically neighboring one another in the Z-direction.

The preliminary stack structure 102 may include a desired quantity and distribution (e.g., spacing and arrangement) of staircase structures 110. The preliminary stack structure 102 may include a single (e.g., only one) staircase structure 110, or may include multiple (e.g., more than one) staircase structures 110. If the preliminary stack structure 102 includes multiple staircase structures 110, each of the staircase structures 110 may be positioned at a different vertical location (e.g., in the Z-direction) within the preliminary stack structure 102, or at least one of the staircase structures 110 may be positioned at substantially the same vertical location (e.g., in the Z-direction) within the preliminary stack structure 102 as at least one other of the staircase structures 110. If multiple staircase structures 110 are positioned at substantially the same vertical location (e.g., in the Z-direction) within the preliminary stack structure 102, the staircase structures 110 may be horizontally positioned in series with one another, in parallel with one another, or a combination thereof. If multiple staircase structures 110 at substantially the same vertical location (e.g., in the Z-direction) (if any) within the preliminary stack structure 102 are horizontally positioned in series with one another, each of the staircase structures 110 may exhibit a positive slope, each of the staircase structures 110 may exhibit a negative slope, or at least one of the staircase structures 110 may exhibit a positive slope and at least one other of the staircase structures 110 may exhibit a negative slope. For example, the preliminary stack structure 102 may include one or more stadium structures individually comprising a first staircase structure 110 having positive slope, and a second staircase structure 110 horizontally neighboring and in series with the first staircase structure 110 and having negative slope.

Figure 1B:
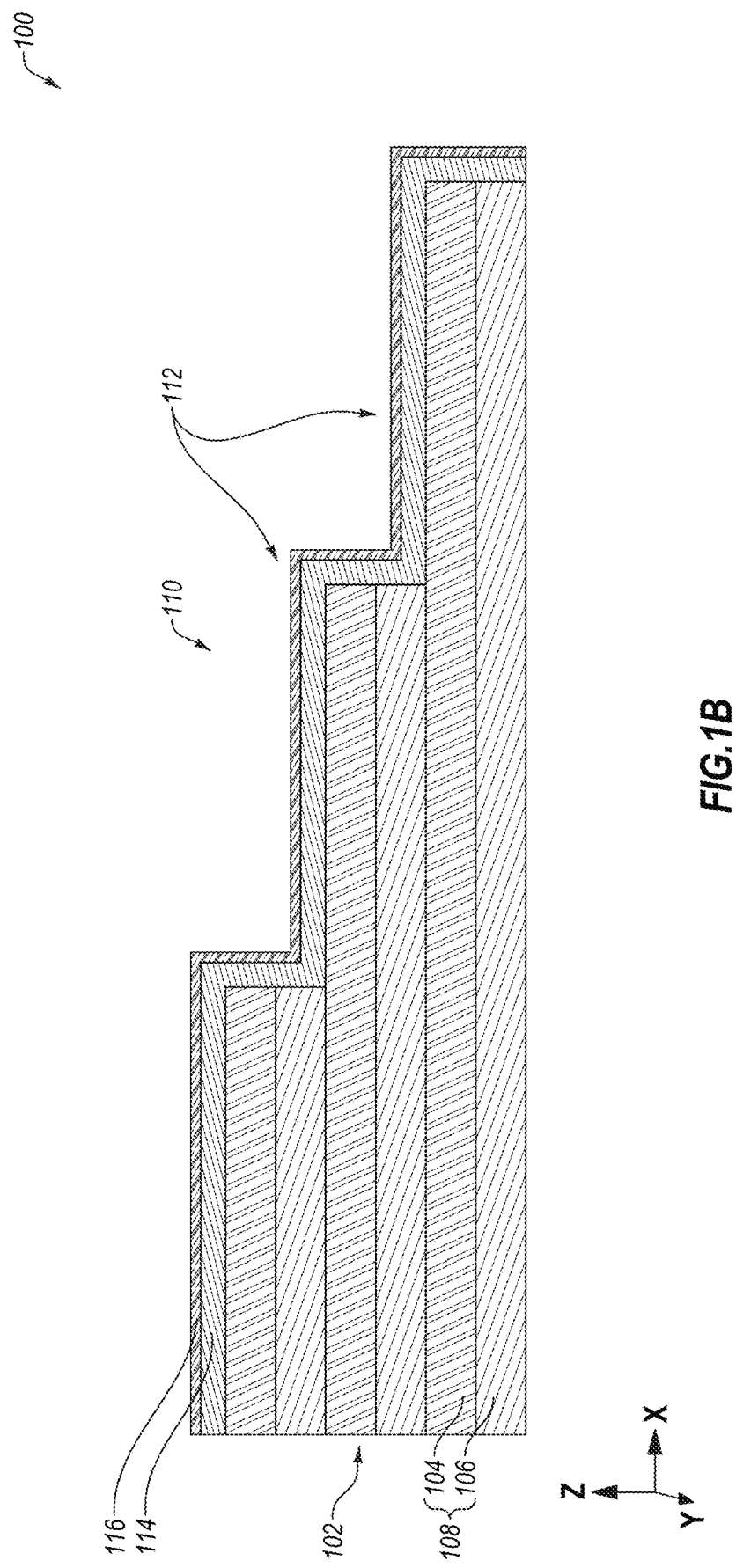

Referring next to FIG. 1B, a first liner material 114 may be formed on or over exposed surfaces of the preliminary stack structure 102. As shown in FIG. 1B, the first liner material 114 may be formed on or over exposed surfaces (e.g., exposed horizontal surfaces, exposed vertical surfaces) of the preliminary stack structure 102 at least partially defining the staircase structure 110. Optionally, the first liner material 114 may also be formed on or over additional exposed surfaces (e.g., exposed horizontally extending surfaces, exposed vertically extending surfaces) of the preliminary stack structure 102 outside of the boundaries (e.g., horizontal boundaries, vertical boundaries) of the staircase structure 110. The first liner material 114 may at least partially (e.g., substantially) conform to a topography defined by the surfaces (e.g., horizontal surfaces, vertical surfaces) upon which the first liner material 114 is formed.

The first liner material 114 may be formed of and include at least one material having different etch selectivity than the sacrificial material 106 of the preliminary stack structure 102. Following additional processing, portions of the first liner material 114 may be employed to protect portions of a stack structure formed from the preliminary stack structure 102 during subsequent processing acts (e.g., subsequent material removal acts, such as subsequent etching acts), as described in further detail below. As a non-limiting example, the first liner material 114 may be formed of and include at least one conductive material, such as one or more of at least one metal, at least one alloy, and at least one conductive metal-containing material (e.g., a conductive metal nitride, a conductive metal silicide, a conductive metal carbide, a conductive metal oxide). As another non-limiting example, the first liner material 114 may comprise one or more of at least one insulative material (e.g., a dielectric oxide material, a dielectric nitride material, a dielectric oxynitride material, a dielectric carboxynitride material), and at least one semiconductive material (e.g., undoped silicon, such as undoped polycrystalline silicon; doped silicon, such as doped polycrystalline silicon). In some embodiments, the first liner material 114 is formed of and includes W. In additional embodiments, the first liner material 114 is formed of and includes TiN. The first liner material 114 may be substantially homogeneous, or the first liner material 114 may be heterogeneous.

The first liner material 114 may be formed to exhibit a desirable thickness less than the horizontal dimension (e.g., width) in the X-direction of the individual steps 112 of the staircase structure 110. The thickness of the first liner material 114 may, for example, be less than or equal to half of a width in the X-direction of a horizontally smallest step 112 of the staircase structure 110. By way of non-limiting example, the thickness of the first liner material 114 may be within a range of from about 5 nanometers (nm) to about 1000 nm. In some embodiments, a thickness of the first liner material 114 is less than a thickness of the insulative material 104 of an individual tier 108 of the preliminary stack structure 102.

Still referring to FIG. 1B, optionally, at least one dielectric liner material 116 may be formed on or over surfaces of the first liner material 114. The formation of the dielectric liner material 116 may at least partially depend on a material composition of the first liner material 114 and of at least one additional liner material (e.g., a second liner material) to subsequently be formed over the first liner material 114, as described in further detail below. For example, if the first liner material 114 and the additional liner material are formed of and include materials that, when provided in physical contact with one another, would otherwise form a galvanic cell, the dielectric liner material 116 may be formed to intervene between the first liner material 114 and the additional liner material to prevent the formation of the galvanic cell. Forming the dielectric liner material 116 may thus circumvent undesirable damage (e.g., corrosion damage) that may otherwise be effectuated by the formation of the galvanic cell. If formed, the dielectric liner material 116 may at least partially (e.g., substantially) conform to a topography defined by the surfaces (e.g., horizontal surfaces, vertical surfaces) of the first liner material 114.

If formed, the dielectric liner material 116 may be formed of and include at least one dielectric material (e.g., a dielectric oxide material, a dielectric nitride material, a dielectric oxynitride material, a dielectric carboxynitride material). As non-limiting example, the dielectric liner material 116 may be formed of and include at least one oxygen-containing dielectric material, such as a one or more of a dielectric oxide material (e.g., one or more of an oxide of the first liner material 114, $SiO_x$, phosphosilicate glass, borosilicate glass, borophosphosilicate glass, fluorosilicate glass, $AlO_x$, $HfO_x$, $NbO_x$, $TiO_x$), a dielectric oxynitride material (e.g., $SiO_xN_y$), and a dielectric carboxynitride material (e.g., $SiO_xC_zN_y$). In some embodiments, the dielectric liner material 116 is formed of and includes $SiO_x$ (e.g., $SiO_2$). In additional embodiments, the dielectric liner material 116 is formed of and includes an oxide of a material (e.g., metal) of the first liner material 114. If formed, the dielectric liner material 116 may be substantially homogeneous, or the dielectric liner material 116 may be heterogeneous.

The first liner material 114 and the dielectric liner material 116 (if any) may be formed using conventional processes (e.g., conventional conformal deposition processes, such as one or more of a conventional conformal CVD process and a conventional ALD process; conventional oxidation processes) and conventional processing equipment, which are not described in detail herein.

Figure 1C:
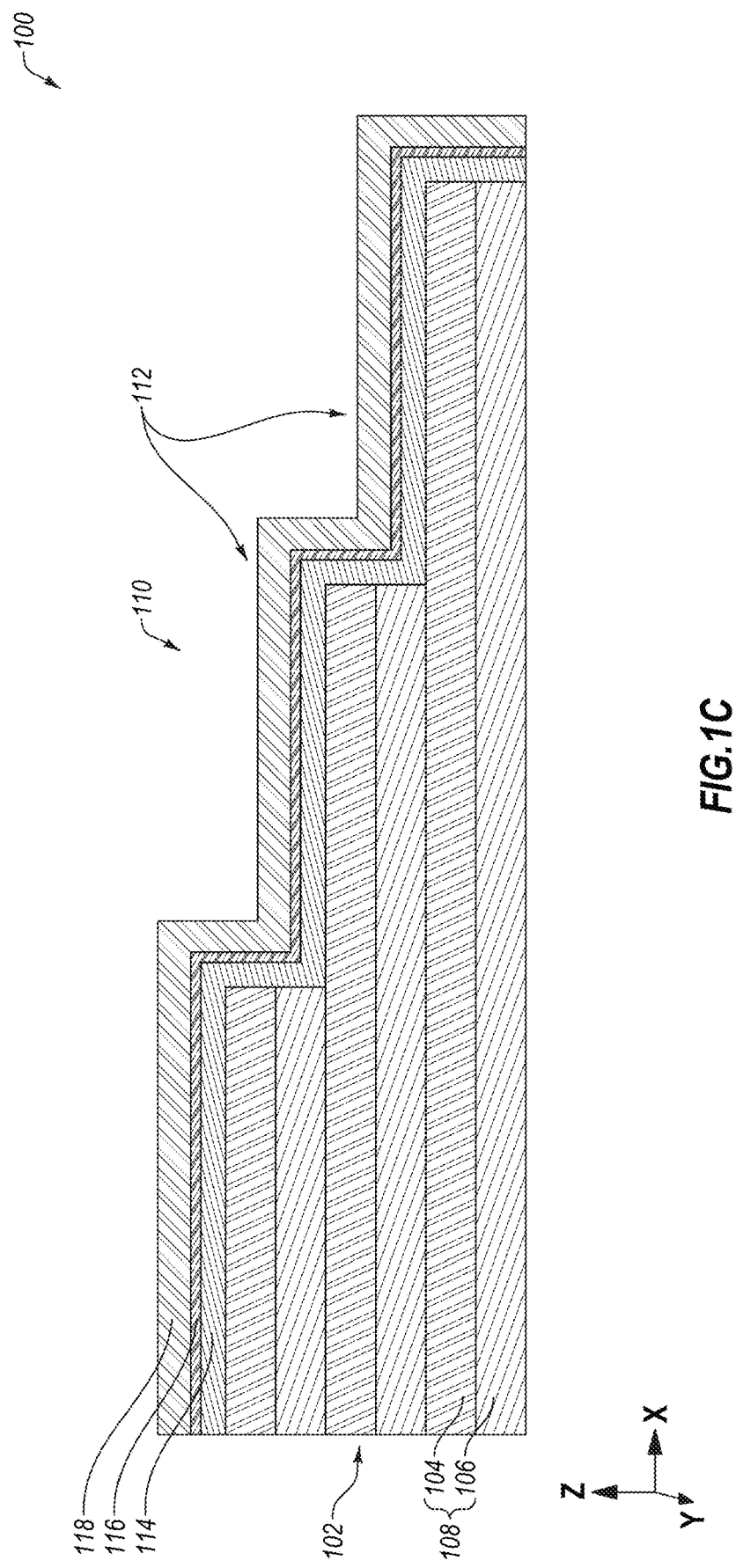

Referring next to FIG. 1C, a second liner material 118 may be formed on or over the first liner material 114. If the dielectric liner material 116 is not formed on the first liner material 114, the second liner material 118 may be formed on surfaces of the first liner material 114. Conversely, if the dielectric liner material 116 is formed on the first liner material 114, the second liner material 118 may be formed on surfaces of the dielectric liner material 116. The second liner material 118 may be formed to cover exposed horizontally extending surfaces and exposed vertically extending surfaces of the microelectronic device structure 100 inside of and outside of boundaries (e.g., horizontal boundaries, vertical boundaries) of the staircase structure 110. The second liner material 118 may at least partially (e.g., substantially) conform to a topography defined by the surfaces (e.g., horizontal surfaces, vertical surfaces) upon which the second liner material 118 is formed.

The second liner material 118 may be formed of and include at least one material having different etch selectivity than the first liner material 114 and the dielectric liner material 116 (if any). The second liner material 118 may also have, or may subsequently be further processed (e.g., doped) to have, different etch selectivity than the sacrificial material 106 of the preliminary stack structure 102. Following additional processing, portions of the second liner material 118 may be employed to protect portions of the stack structure formed from the preliminary stack structure 102 during subsequent processing acts (e.g., subsequent material removal acts, such as subsequent etching acts), as described in further detail below. As a non-limiting example, the second liner material 118 may be formed of and include at least one semiconductive material, such as one or more of a silicon material, a silicon-germanium material, a boron material, a germanium material, a gallium arsenide material, a gallium nitride material, and an indium phosphide material. The second liner material 118 may, for example, be formed of and include at least one silicon material. As used herein, the term "silicon material" means and includes a material that includes elemental silicon or a compound of silicon. As an additional non-limiting example, the second liner material 118 may be formed of and include one or more of at least one insulative material (e.g., a dielectric oxide material, a dielectric nitride material, a dielectric oxynitride material, a dielectric carboxynitride material), and at least one conductive material (e.g., a metal, an alloy, a conductive metal-containing material). In some embodiments, the second liner material 118 is formed of and includes polycrystalline silicon. In additional embodiments, the second liner material 118 is formed of and includes a dielectric oxide material (e.g., $SiO_x$, such as $SiO_2$). In further embodiments, the second liner material 118 is formed of and includes a dielectric nitride material (e.g., $SiN_y$, such as $Si_3N_4$). The second liner material 118 may be substantially homogeneous, or the second liner material 118 may be heterogeneous.

The second liner material 118 may be formed to exhibit a desirable thickness less than the horizontal dimension (e.g., width) in the X-direction of the individual steps 112 of the staircase structure 110. The thickness of the second liner material 118 may, for example, be less than or equal to half of a width in the X-direction of a horizontally smallest step 112 of the staircase structure 110. By way of non-limiting example, the thickness of the second liner material 118 may be within a range of from about 5 nm to about 1000 nm. In some embodiments, a thickness of the second liner material 118 is less than a thickness of the insulative material 104 of an individual tier 108 of the preliminary stack structure 102.

The second liner material 118 may be formed using one or more conventional conformal deposition processes, such as one or more of a conventional conformal CVD process and a conventional ALD process.

Figure 1D:
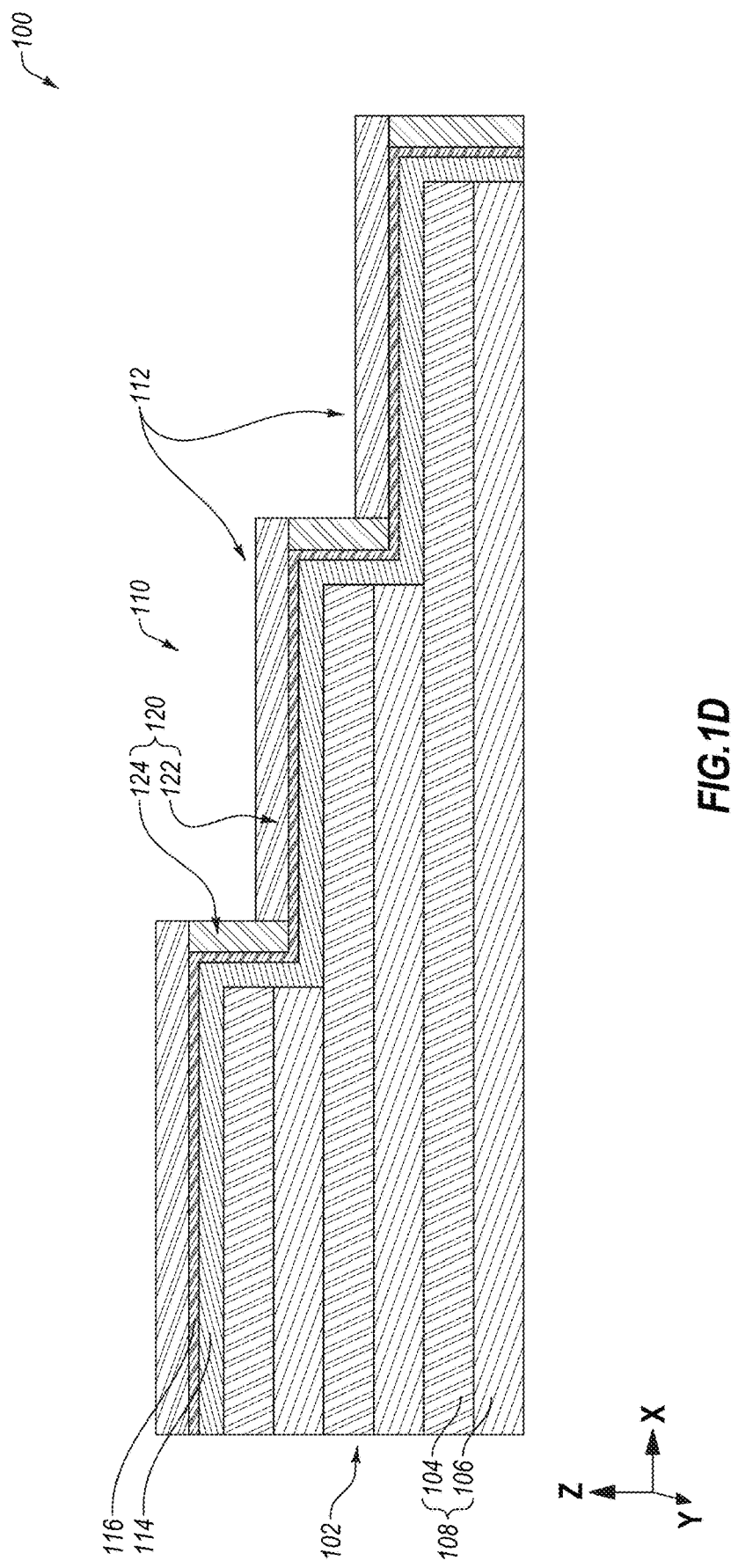

Next, referring next to FIG. 1D, the second liner material 118 (FIG. 1C) may be doped (e.g., impregnated) with one or more dopants (e.g., chemical species) to form a doped second liner material 120. As shown in FIG. 1D, the doped second liner material 120 may include horizontally extending portions 122 and vertically extending portions 124. A maximum vertical depth (e.g., in the Z-direction) of the dopant(s) within the horizontally extending portions 122 of the doped second liner material 120 may be greater than a maximum horizontal depth (e.g., in the X-direction) of the dopant(s) within the vertically extending portions 124 of the doped second liner material 120. Put another way, the dopant(s) may extend relatively deeper into thicknesses (e.g., in the Z-direction) of the horizontally extending portions 122 of the doped second liner material 120 than into thicknesses (e.g., in the X-direction) of the vertically extending portions 124 of the doped second liner material 120. In some embodiments, the dopant(s) are dispersed to or substantially proximate lower vertical boundaries (e.g., in the Z-direction) of the horizontally extending portions 122 of the doped second liner material 120; and the dopant(s) are dispersed only partially through (e.g., less than completely through, such as less than or equal to about 75 percent through, less than or equal to about 50 percent through, or less than or equal to about 25 percent through) the thicknesses (e.g., in the X-direction) of the vertically extending portions 124 of the doped second liner material 120. For example, the vertically extending portions 124 of the doped second liner material 120 may include doped regions proximate exposed surfaces thereof, and substantially undoped regions horizontally adjacent to (e.g., horizontally underlying in the X-direction) the doped regions.

The dopant(s) of the doped second liner material 120 may comprise material(s) promoting or facilitating selective removal of the vertically extending portions 124 of the doped second liner material 120 relative to the horizontally extending portions 122 of the doped second liner material 120, the first liner material 114, and the dielectric liner material 116 (if any). Depending on a material composition of the second liner material 118 (FIG. 1C), the dopant(s) may, for example, comprise one or more of carbon (C), boron (B), at least one N-type dopant (e.g., one or more of phosphorus (P), arsenic (Ar), antimony (Sb), and bismuth (Bi)), at least one other P-type dopant (e.g., a P-type dopant other than B, such as aluminum (Al) and/or gallium (Ga)), nitrogen (N), oxygen (O), fluorine (F), chlorine (Cl), bromine (Br), hydrogen (H), deuterium ($^2$H), helium (He), neon (Ne), and argon (Ar). In some embodiments, such as some embodiments wherein the second liner material 118 (FIG. 1C) comprises one or more of polycrystalline silicon, a dielectric oxide material (e.g., $SiO_x$), and a dielectric nitride material (e.g., $SiN_y$), the dopant comprises carbon (C). In additional embodiments, such as some embodiments wherein the second liner material 118 (FIG. 1C) comprises one or more of polycrystalline silicon and a dielectric oxide material (e.g., $SiO_x$), the dopant comprises boron (B).

The horizontally extending portions 122 of the doped second liner material 120 may individually exhibit a substantially homogeneous distribution of dopant(s) within the material thereof, or may individually exhibit a heterogeneous distribution of dopant(s) within the material thereof. In some embodiments, each of the horizontally extending portions 122 of the doped second liner material 120 exhibits a substantially homogeneous distribution of dopant(s) within the material thereof, such that the horizontally extending portion 122 exhibits a substantially uniform (e.g., even, non-variable) distribution of the dopant(s) within the material thereof. For example, amounts (e.g., atomic concentrations) of the dopant(s) included in each individual horizontally extending portion 122 of the doped second liner material 120 may not substantially vary throughout the vertical dimensions (e.g., in the Z-direction) of the horizontally extending portion 122. In additional embodiments, one or more (e.g., each) of the horizontally extending portions 122 of the doped second liner material 120 exhibits a substantially heterogeneous distribution of dopant(s) within the material thereof, such that the horizontally extending portion(s) 122 exhibit a substantially non-uniform (e.g., non-even, variable) distribution of the dopant(s) within the material thereof. For example, amounts (e.g., atomic concentrations) of the dopant(s) included in each individual horizontally extending portion 122 of the doped second liner material 120 may vary (e.g., increase, decrease) throughout a vertical dimension (e.g., in the Z-direction) of the horizontally extending portion 122.

As previously discussed, the vertically extending portions 124 of the doped second liner material 120 may individually exhibit a heterogeneous distribution of dopant(s) within the material thereof, such that each vertically extending portion 124 individually exhibits a doped region and a substantially undoped region. In turn, each of the doped regions of the vertically extending portions 124 of the doped second liner material 120 may individually exhibit a substantially homogeneous distribution of dopant(s) within the material thereof, or may individually exhibit a heterogeneous distribution of dopant(s) within the material thereof. In some embodiments, each of the doped regions of the vertically extending portions 124 of the doped second liner material 120 exhibits a substantially homogeneous distribution of dopant(s) within the semiconductive material thereof, such that the doped region of each vertically extending portion 124 exhibits a substantially uniform (e.g., even, non-variable) distribution of the dopant(s) within the material thereof. For example, amounts (e.g., atomic concentrations) of the dopant(s) included in the doped region of each vertically extending portion 124 of the doped second liner material 120 may not substantially vary throughout the horizontal dimensions (e.g., in the X-direction) of the doped region. In additional embodiments, each of the doped regions of the vertically extending portions 124 of the doped second liner material 120 exhibits a substantially heterogeneous distribution of dopant(s) within the material thereof, such that the doped region of each vertically extending portion 124 exhibits a substantially non-uniform (e.g., non-even, variable) distribution of the dopant(s) within the material thereof. For example, amounts (e.g., atomic concentrations) of the dopant(s) included in the doped region of each vertically extending portion 124 of the doped second liner material 120 may vary (e.g., increase, decrease) throughout horizontal dimensions (e.g., in the X-direction) of the doped region.

The second liner material 118 (FIG. 1C) may be doped with at least one dopant to form a doped second liner material 120 using conventional processes (e.g., conventional implantation processes, conventional diffusion processes), which are not described in detail herein. As a non-limiting example, one or more carbon-containing species (e.g., carbon atoms, carbon-containing molecules, carbon ions, carbon-containing ions) may be implanted into the second liner material 118 (FIG. 1C) to form the doped second liner material 120. As another non-limiting example, one or more boron-containing species (e.g., boron atoms, boron-containing molecules, boron ions, boron-containing ions) may be implanted into the second liner material 118 (FIG. 1C) to form the doped second liner material 120. In some embodiments, following dopant implantation, an amount of dopant within at least the horizontally extending portions 122 of the doped second liner material 120 is within a range of from about $1.0 \times 10^{15}$ dopant atoms per cubic centimeter ($cm^3$) to about $1.0 \times 10$ W dopant atoms/$cm^3$.

Figure 1E:
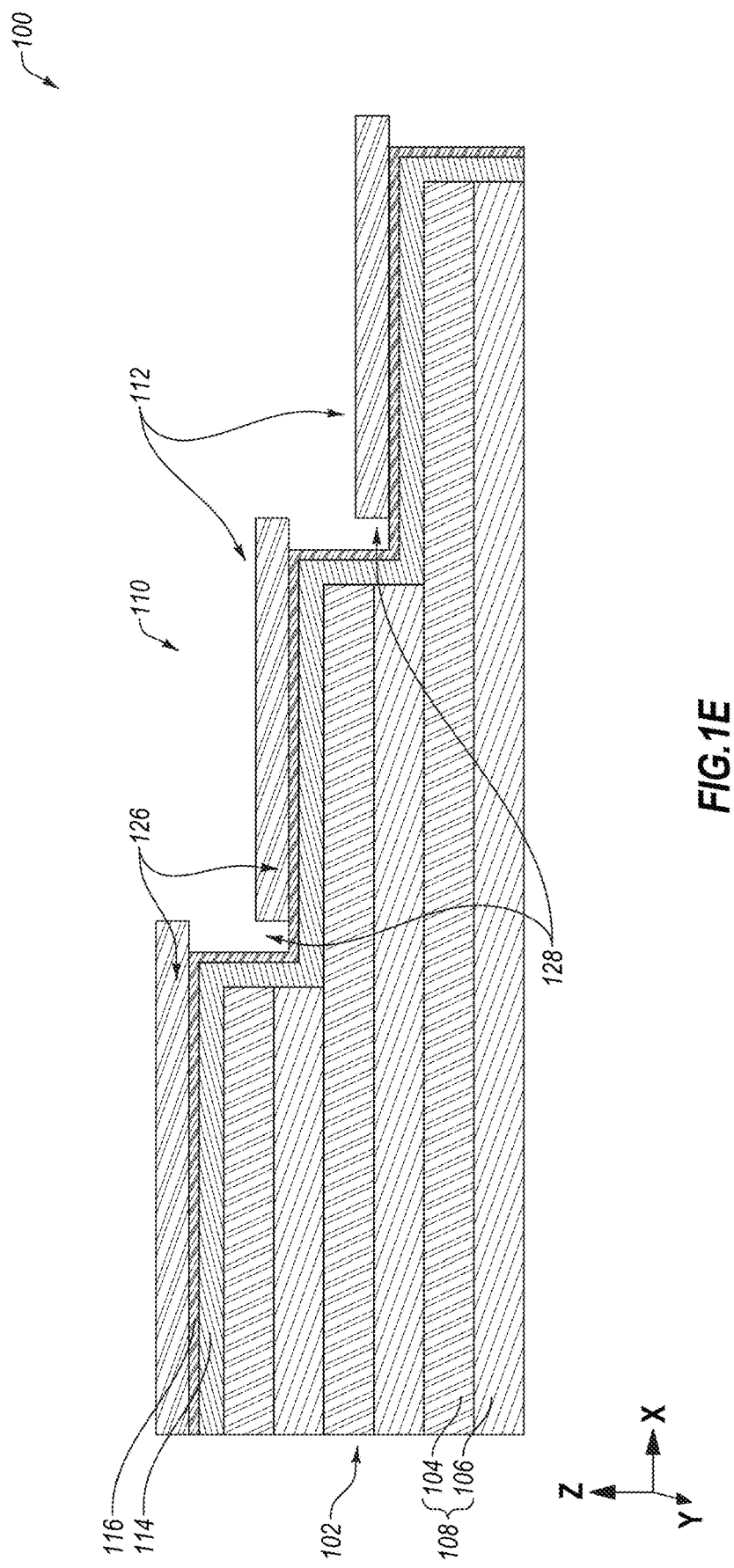

Referring next to FIG. 1E, the vertically extending portions 124 (FIG. 1D) of the doped second liner material 120 (FIG. 1D) may be substantially removed to expose vertically extending surfaces of the dielectric liner material 116 (if present) or the first liner material 114. Regions of the horizontally extending portions 122 (FIG. 1D) of the doped second liner material 120 (FIG. 1D) remaining following the removal of the vertically extending portions 124 (FIG. 1D) of the doped second liner material 120 (FIG. 1D) may form upper pad structures 126. The upper pad structures 126 may be separate and discrete from one another. As shown in FIG. 1E, portions of the upper pad structures 126 may be positioned on or over horizontally extending portions of the first liner material 114, and additional portions of the upper pad structures 126 may horizontally extend (e.g., in the X-direction) past horizontal boundaries (e.g., in the X-direction) of the horizontally extending portions of the first liner material 114. As shown in FIG. 1E, selective removal of the vertically extending portions 124 (FIG. 1D) of the doped second liner material 120 (FIG. 1D) may form first air gaps 128 intervening between neighboring upper pad structures 126. The first air gaps 128 may each individually vertically extend (e.g., in the Z-direction) from a lower vertical boundary (e.g., a lower surface) of a relatively vertically higher upper pad structure 126 to a lower vertical boundary (e.g., a lower surface) of a relatively vertically lower upper pad structure 126 horizontally neighboring the relatively vertically higher upper pad structure 126. In addition, the first air gaps 128 may each individually horizontally extend (e.g., in the X-direction) from a horizontal boundary (e.g., a side surface) of one of the upper pad structures 126 to a horizontal boundary (e.g., a vertically extending surface) of a portion of the dielectric liner material 116 (if any) or the first liner material 114 horizontally neighboring the upper pad structure 126.

Thicknesses (e.g., in the Z-direction) of the upper pad structures 126 may be less than or equal to thicknesses of the horizontally extending portions 122 (FIG. 1D) of the doped second liner material 120 (FIG. 1D). In some embodiments, the material removal process employed to substantially remove the vertically extending portions 124 (FIG. 1D) of the doped second liner material 120 (FIG. 1D) also partially removes the horizontally extending portions 122 (FIG. 1D) of the doped second liner material 120 (FIG. 1D), such that a thickness of each of the upper pad structures 126 is less than (e.g., thinner than) a thickness of the horizontally extending portion 122 (FIG. 1D) of the doped second liner material 120 (FIG. 1D) from which the upper pad structure 126 was formed.

The vertically extending portions 124 (FIG. 1D) of the doped second liner material 120 (FIG. 1D) may be removed (and the upper pad structures 126 may be formed) by treating the doped second liner material 120 (FIG. 1D) with at least one etchant (e.g., wet etchant). By way of non-limiting example, depending on the material composition of the doped second liner material 120 (FIG. 1D) the etchant may comprise one or more of hydrofluoric acid (HF), a buffered oxide etchant (BOE), nitric acid ($HNO_3$), and tetramethylammonium hydroxide (TMAH). In some embodiments wherein the doped second liner material 120 (FIG. 1D) comprises polycrystalline silicon, the material removal process includes treating the microelectronic device structure 100 with TMAH to remove the vertically extending portions 124 (FIG. 1D) of the doped second liner material 120 (FIG. 1D). In additional embodiments, the material removal process includes treating the microelectronic device structure 100 with a solution including water and HF at a ratio within a range of from about 500:1 to about 100:1. The doped second liner material 120 (FIG. 1D) may be exposed to the etchant using conventional processes (e.g., a spin-coating process, a spray-coating process, an immersion-coating process, a vapor-coating process, a soaking process, combinations thereof) and conventional processing equipment, which are not described in detail herein.

Figure 1F:
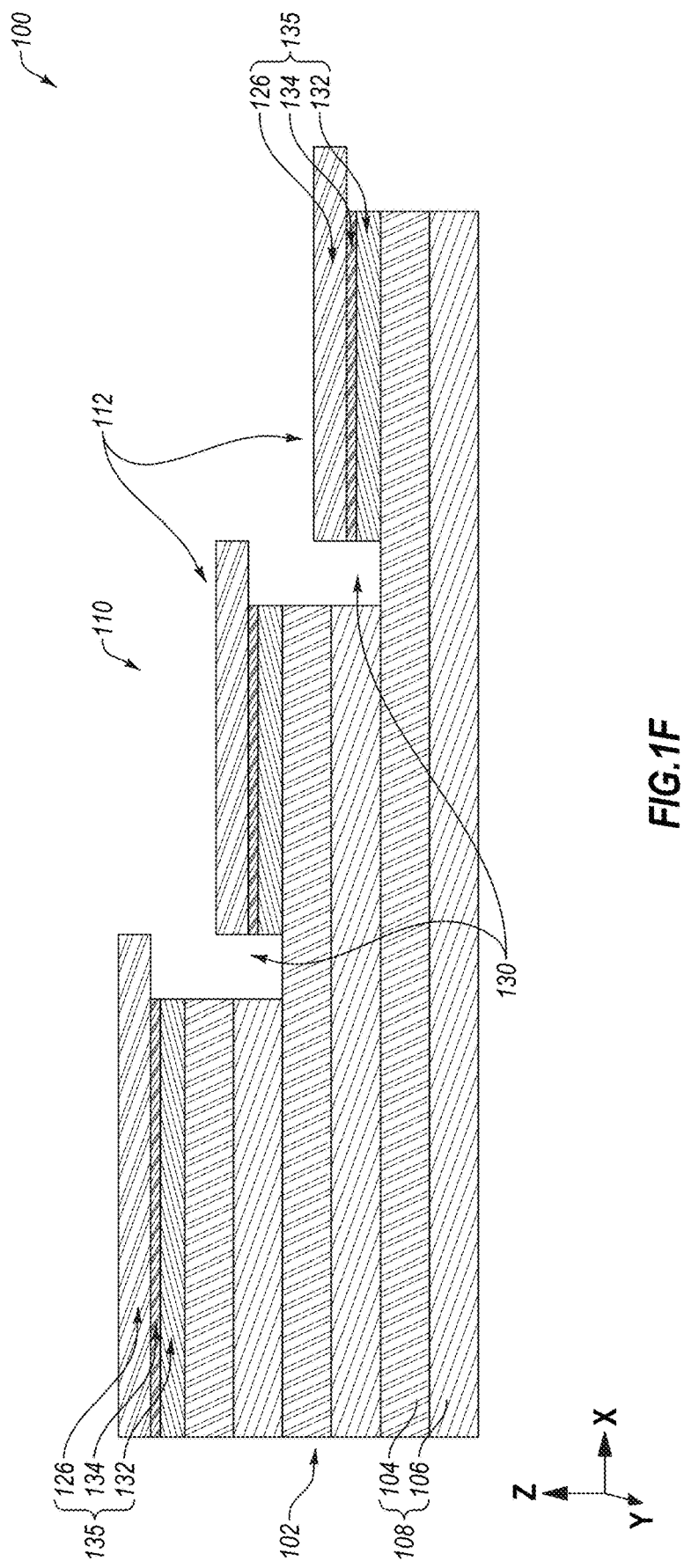

Referring next to FIG. 1F, vertically extending portions of the dielectric liner material 116 (FIG. 1E) (if any) and the first liner material 114 (FIG. 1E) exposed by the first air gaps 128 (FIG. 1E) may be removed to form second air gaps 130 and expose vertically extending surfaces of the preliminary stack structure 102 (e.g., vertically extending surfaces of the staircase structure 110, such as vertically extending surfaces of the steps 112). Portions of the first liner material 114 (FIG. 1E) remaining following the material removal process form lower pad structures 132. In addition, portions of the dielectric liner material 116 (FIG. 1E) (if any) remaining following the material removal process form middle pad structures 134. As shown in FIG. 1F, the material removal process may form composite pad structures 135 (e.g., heterogeneous pad structures, multilayer pad structures) individually including a lower pad structure 132, an upper pad structure 126 vertically neighboring the lower pad structure 132, and, optionally, a middle pad structure 134 vertically between the lower pad structure 132 and the upper pad structure 126.

As shown in FIG. 1F, the second air gaps 130 may have relatively greater horizontal dimensions (e.g., widths) in the X-direction than the first air gaps 128 (FIG. 1E). The second air gaps 130 are formed to intervene between neighboring composite pad structures 135. The second air gaps 130 may each individually vertically extend (e.g., in the Z-direction) from a lower vertical boundary (e.g., a lower surface) of an upper pad structure 126 of a relatively vertically higher composite pad structure 135 to a lower vertical boundary (e.g., a lower surface) of a lower pad structure 132 of a relatively vertically lower composite pad structure 135 horizontally neighboring the relatively vertically higher composite pad structure 135. In addition, the second air gaps 130 may each individually horizontally extend (e.g., in the X-direction) from a horizontal boundary (e.g., a side surface) of one of the composite pad structures 135 to a horizontal boundary of a step 112 of the staircase structure 110 of the preliminary stack structure 102 horizontally neighboring the composite pad structure 135. Each second air gap 130 may individually have horizontal boundaries partially defined by opposing vertically extending surfaces of a composite pad structure 135 (including vertically extending surfaces of the lower pad structure 132, the upper pad structure 126, and the middle pad structures 134 (if any) thereof) and a step 112 of the staircase structure 110 (including vertically extending surfaces of the insulative material 104 and the sacrificial material 106 of the tier 108 defining the step 112). In addition, each second air gap 130 may individually have vertical boundaries partially defined by a lower, horizontally extending surface of an upper pad structure 126 of a composite pad structure 135 and an upper, horizontally extending surface of a step 112 of the staircase structure 110 positioned vertically below the composite pad structure 135. The step 112 of the staircase structure 110 may horizontal neighbor and may be positioned vertically below another step 112 of the staircase structure 110 that the composite pad structure 135 directly physically contacts.

Still referring to FIG. 1F, for an individual composite pad structure 135, the upper pad structure 126 thereof may have a greater horizontal dimension in the X-direction than the lower pad structure 132 thereof and the middle pad structure 134 thereof (if any). Along a first horizontal boundary in the X-direction of an individual composite pad structure 135, vertically extending surfaces of the upper pad structure 126, the lower pad structure 132, and the middle pad structure 134 (if any) of the composite pad structure 135 may be substantially coplanar with one another. However, along a second horizontal boundary in the X-direction of the composite pad structure 135, a vertically extending surface of the upper pad structure 126 of the composite pad structure 135 may be horizontally offset in the X-direction from vertically extending surfaces of the lower pad structure 132 and the middle pad structure 134 (if any) of the composite pad structure 135. The upper pad structure 126 may horizontally project past the vertically extending surfaces of the lower pad structure 132 and the middle pad structure 134 (if any). For an individual composite pad structure 135, a portion of the upper pad structure 126 thereof may project into the horizontal area of a second air gap 130 horizontally neighboring the composite pad structure 135 in the X-direction. A horizontal center of an individual composite pad structure 135 in the X-direction may be offset from a horizontal center in the X-direction of the step 112 of the staircase structure 110 directly vertically under the composite pad structure 135.

The vertically extending portions of the dielectric liner material 116 (FIG. 1E) (if any) and the first liner material 114 (FIG. 1E) may be removed by treating the microelectronic device structure 100 with at least one etchant (e.g., a dry etchant, a wet etchant) formulated to remove the vertically extending portions of the dielectric liner material 116 (FIG. 1E) (if any) and the first liner material 114 (FIG. 1E) without substantially removing exposed portions of the upper pad structures 126, the insulative material 104, and sacrificial material 106. As a non-limiting example, in some embodiments wherein the first liner material 114 (FIG. 1E) comprises metallic material (e.g., a metal, an alloy, a conductive metal-containing material), the at least one etchant comprises a phosphoric-acetic-nitric acid (PAN) etchant. As another non-limiting example, in additional embodiments wherein the first liner material 114 (FIG. 1E) comprises metallic material, the at least one etchant comprises nitrogen trifluoride ($NF_3$). The material removal process may remove the vertically extending portions of the dielectric liner material 116 (FIG. 1E) (if any) and the first liner material 114 (FIG. 1E), and may also clean and rinse exposed surfaces of the preliminary stack structure 102 and the upper pad structures 126.

Figure 1G:
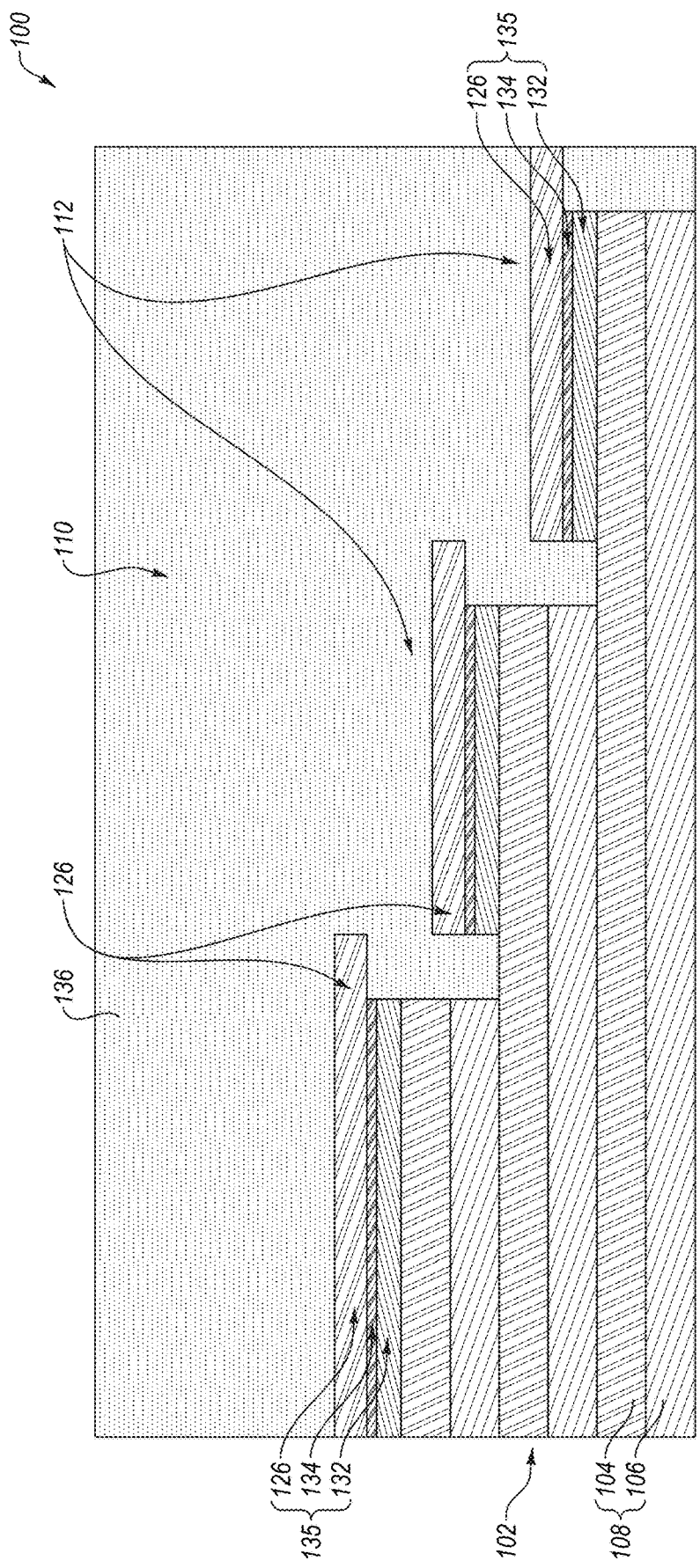

Referring next to FIG. 1G, an isolation material 136 may be formed on or over the preliminary stack structure 102, the staircase structure 110, and the composite pad structures 135. As shown in FIG. 1G, the isolation material 136 may substantially fill the second air gaps 130 (FIG. 1F), and may also extend across and cover surfaces of the composite pad structures 135 (including surfaces of the lower pad structures 132, the upper pad structures 126, and the middle pad structures 134 (if any) thereof) and the steps 112 of the staircase structure 110 (including surfaces of the insulative material 104 and the sacrificial material 106 of the tiers 108 of the preliminary stack structure 102 defining the steps 112). The isolation material 136 may be formed to have a substantially planar upper boundary, and a non-planar lower boundary complementary (e.g., substantially mirroring) to the topography thereunder.

The isolation material 136 may be formed of and include at least one dielectric material, such as one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$), at least one dielectric nitride material (e.g., $SiN_y$), at least one dielectric oxynitride material (e.g., $SiO_xN_y$), and at least one dielectric carboxynitride material (e.g., $SiO_xC_zN_y$). A material composition of the isolation material 136 is different than a material composition of the sacrificial material 106 of the tiers 108 of the preliminary stack structure 102. The material composition of the isolation material 136 may be substantially the same as or may be different than a material composition of the insulative material 104 of the tiers 108 of the preliminary stack structure 102. In some embodiments, the isolation material 136 is formed of and includes $SiO_2$. The isolation material 136 may be substantially homogeneous, or may be heterogeneous.

Figure 1H:
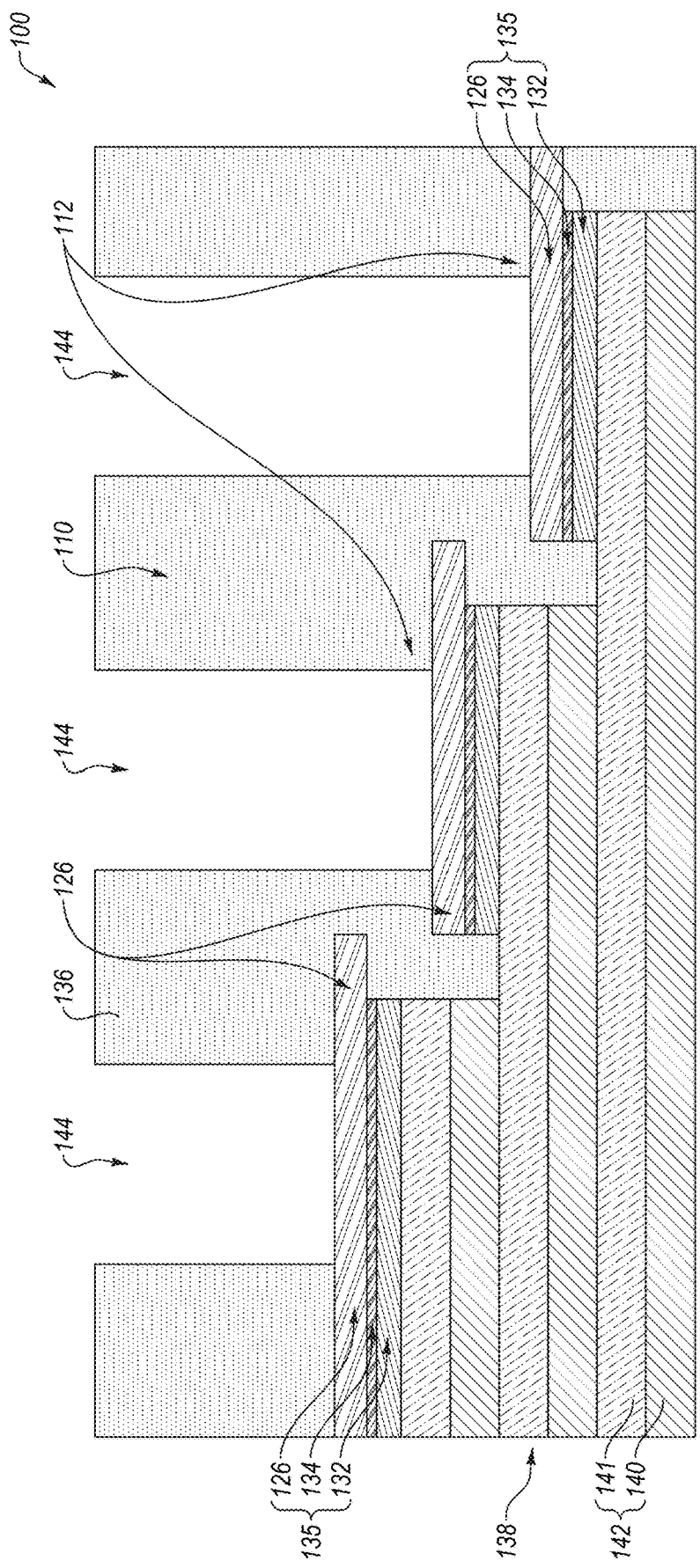

Referring next to FIG. 1H, following the formation of the isolation material 136, the microelectronic device structure 100 may be subjected to replacement gate processing to at least partially replace the sacrificial material 106 (FIG. 1G) of the tiers 108 (FIG. 1G) of the preliminary stack structure 102 (FIG. 1G) with conductive structures 140 and form a stack structure 138. Thereafter, portions of the isolation material 136 may be removed, to form initial contact openings 144 vertically extending through the isolation material 136 to the composite pad structures 135.

As shown in FIG. 1H, the stack structure 138 is formed to include a vertically alternating (e.g., in the Z-direction) sequence of the conductive structures 140 and insulative structures 141 arranged in tiers 142. Each of the tiers 142 of the stack structure 138 includes at least one of the conductive structures 140 vertically neighboring at least one of the insulative structures 141. The conductive structures 140 may be formed of and include at least one conductive material, such as one or more of a metal, an alloy, a conductive metal oxide, a conductive metal nitride, a conductive metal silicide, and a conductively doped semiconductor material. In some embodiments, the conductive structures 140 are formed of and include W. The insulative structures 141 may comprise portions of the insulative material 104 (FIG. 1G) of the tiers 108 (FIG. 1G) of the preliminary stack structure 102 (FIG. 1G) remaining (e.g., unremoved) following the replacement gate processing. In some embodiments, the insulative structures 141 are formed of and include $SiO_2$. The composite pad structures 135 may physical contact the tiers 142 of the stack structure 138 at the steps 112 of the staircase structure 110.

During replace gate processing, the preliminary stack structure 102 (FIG. 1G) may be subjected to a material removal process to selectively remove (e.g., selectively exhume) at least a portion (e.g., all, less than all) of the sacrificial material 106 (FIG. 1G) of the tiers 108 (FIG. 1G) of the preliminary stack structure 102 (FIG. 1G) relative to the insulative material 104 (FIG. 1G) of the tiers 108 (FIG. 1G). For example, slots (e.g., slits, openings, trenches) may be formed to vertically extend (e.g., in the Z-direction) through the preliminary stack structure 102 (FIG. 1G), and then portions of the sacrificial material 106 (FIG. 1G) may be selectively removed through the slots using one or more etchants. Thereafter, open volumes (e.g., void spaces) formed by the removed portions of the sacrificial material 106 (FIG. 1G) may be filled with conductive material (e.g., W) to form the conductive structures 140.

Still referring to FIG. 1H, the initial contact openings 144 may be formed to vertically extend through the isolation material 136 and expose (e.g., uncover) portions of the composite pad structures 135. The initial contact openings 144 may vertically terminate at or within the composite pad structures 135. In some embodiments, the initial contact openings 144 are formed to terminate at or within the upper pad structures 126 of the composite pad structures 135. The composite pad structures 135 may serve as so-called "etch stop" structures to mitigate (e.g., prevent) undesirable damage (e.g., over-etching damage, punch-through damage) to the tiers 142 of the stack structure 138 during the formation of the initial contact openings 144.

Each initial contact opening 144 may individually be formed at a desired horizontal position (e.g., in the X-direction and the Y-direction) within a horizontal area of one of the composite pad structures 135. The initial contact opening 144 may be positioned within a horizontal area of a step 112 of the staircase structure 110 in physical contact with the composite pad structure 135. In some embodiments, within a horizontal area of the staircase structure 110, the initial contact openings 144 are substantially horizontally aligned with one another in the Y-direction. In additional embodiments, within the horizontal area of the staircase structure 110, at least some of the initial contact openings 144 are horizontally offset in the Y-direction from at least some other of the initial contact openings 144.

The initial contact openings 144 may each individually be formed to exhibit a desired horizontal cross-sectional shape. In some embodiments, each of the initial contact openings 144 is formed to exhibit a substantially circular horizontal cross-sectional shape. In additional embodiments, one or more (e.g., each) of the initial contact openings 144 is formed to exhibit a non-circular cross-sectional shape, such as one more of an oblong cross-sectional shape, an elliptical cross-sectional shape, a square cross-sectional shape, a rectangular cross-sectional shape, a tear drop cross-sectional shape, a semicircular cross-sectional shape, a tombstone cross-sectional shape, a crescent cross-sectional shape, a triangular cross-sectional shape, a kite cross-sectional shape, and an irregular cross-sectional shape. In addition, each of the initial contact openings 144 may be formed to exhibit substantially the same horizontal cross-sectional dimensions (e.g., substantially the same horizontal diameter), or at least one of the initial contact openings 144 may be formed to exhibit one or more different horizontal cross-sectional dimensions (e.g., a different horizontal diameter) than at least one other of the initial contact openings 144. In some embodiments, all of the initial contact openings 144 are formed to exhibit substantially the same horizontal cross-sectional dimensions.

The initial contact openings 144 may be formed using conventional process (e.g., conventional material removal processes, such as conventional etching processes) and conventional processing equipment, which are not described in detail herein. As a non-limiting example, the initial contact openings 144 may be formed using anisotropic dry etching, such as one or more of RIE, deep RIE, plasma etching, reactive ion beam etching, and chemically assisted ion beam etching.

Figure 1I:
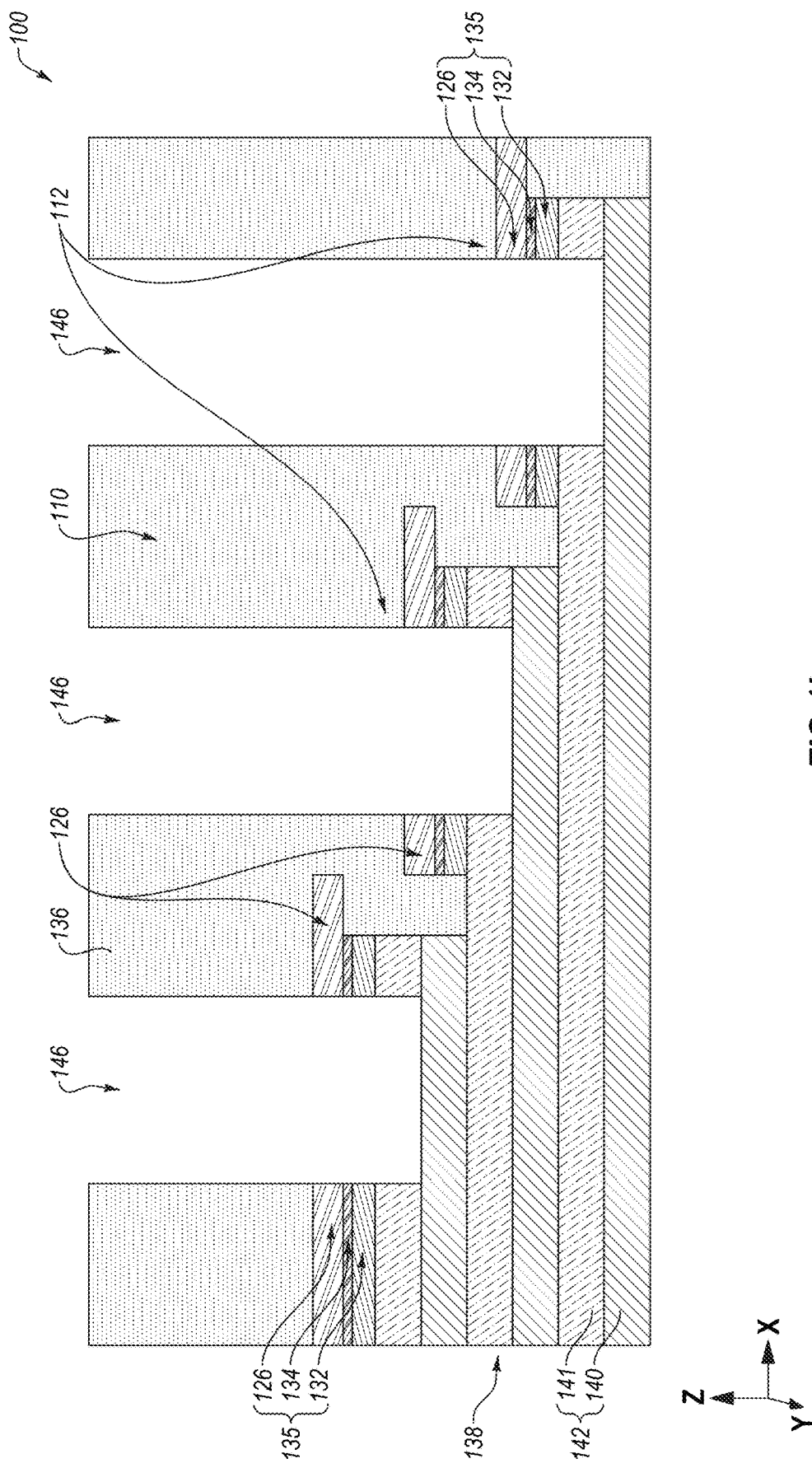

Referring next to FIG. 1I, portions of the composite pad structures 135 within horizontal areas of the initial contact openings 144 (FIG. 1H) may be removed to form contact openings 146 from the initial contact openings 144 (FIG. 1H). As shown in FIG. 1I, in some embodiments, within the horizontal areas of the initial contact openings 144 (FIG. 1H), portions of the insulative structures 141 of the tiers 142 of the stack structure 138 in physical contact with the composite pad structures 135 are also removed to form the contact openings 146. Each contact opening 146 may individually vertically extend to and expose a portion of the conductive structure 140 of an individual tier 142 of the stack structure 138 at an individual step 112 of the staircase structure 110 within the stack structure 138.

Each contact opening 146 may be formed to have a greater vertical dimension (e.g., in the Z-direction) than the initial contact opening 144 from which the contact opening 146 was formed. In addition, each contact opening 146 may be formed to have substantially the same horizontal position (e.g., in the X-direction, in the Y-direction), horizontal dimensions (e.g., in the X-direction, in the Y-direction), and horizontal shape as the initial contact opening 144 from which the contact opening 146 was formed.

The contact openings 146 may be formed by subjecting the microelectronic device structure 100 to an additional material removal process different than the material removal process employed to form the initial contact openings 144 (FIG. 1H). As a non-limiting example, the contact openings 146 may be formed by subjecting portions of at least the composite pad structures 135 within horizontal areas of the initial contact openings 144 (FIG. 1H) to a so-called "punch through" etch.

Figure 1J:
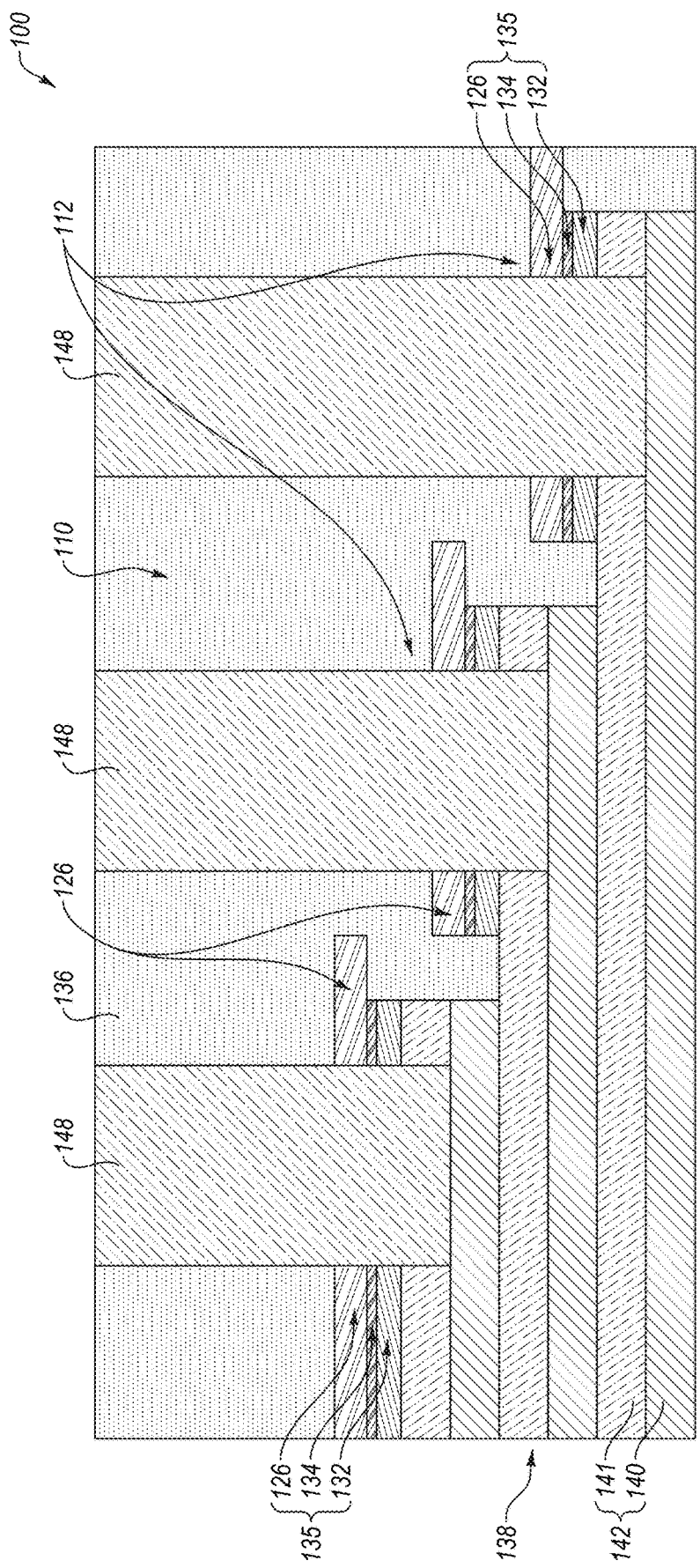

Referring next to FIG. 1J, contact structures 148 may be formed within the contact openings 146 (FIG. 1I). The contact structures 148 may be substantially confined within boundaries (e.g., horizontal boundaries, vertical boundaries) of the contact openings 146 (FIG. 1I), and may substantially fill the contact openings 146 (FIG. 1I). Each contact structure 148 may have a geometric configuration (e.g., shape, dimensions) corresponding to (e.g., substantially the same as) a geometric configuration of the contact opening 146 (FIG. 1I) filled with the contact structure 148. As shown in FIG. 1J, each contact structure 148 may have an uppermost vertical boundary (e.g., an uppermost surface) substantially coplanar with an uppermost vertical boundary (e.g., an uppermost surface) of the isolation material 136, and a lowermost vertical boundary (e.g., a lowermost surface) vertically adjacent an uppermost vertical boundary (e.g., an uppermost surface) of the conductive structure 140 of an individual tier 142 of the stack structure 138. In additional embodiments, one or more (e.g., each) of the contact structures 148 may have an uppermost vertical boundary offset from (e.g., vertically over, vertically under) an uppermost vertical boundary (e.g., an uppermost surface) of the isolation material 136. Each contact structure 148 may individually contact (e.g., physically contact, electrically contact) the conductive structure 140 of the individual tier 142 of the stack structure 138 at an individual step 112 of an individual staircase structure 110 of the stack structure 138.

The contact structures 148 may be formed of and include conductive material. As a non-limiting example, the contact structures 148 may be formed of and include one or more of at least one metal, at least one alloy, and at least one conductive metal-containing material (e.g., a conductive metal nitride, a conductive metal silicide, a conductive metal carbide, a conductive metal oxide). A material composition of the contact structures 148 may be substantially the same as a material composition of the conductive structures 140 of the tiers 142 of the stack structure 138, or the material composition of the contact structures 148 may be different than the material composition of the conductive structures 140 of the tiers 142 of the stack structure 138. In some embodiments, the contact structures 148 are individually formed of and include W. The contact structures 148 may individually be homogeneous, or the contact structures 148 may individually be heterogeneous.

The contact structures 148 may be formed by forming (e.g., non-conformably depositing, such as through one or more of a PVD process and a non-conformal CVD process) conductive material inside and outside of the contact openings 146 (FIG. 1I), and then removing (e.g., through an abrasive planarization process, such as a CMP process) portions of the conductive material overlying an uppermost vertical boundary (e.g., an uppermost surface) of the isolation material 136.

Thus, in accordance with embodiments of the disclosure, a microelectronic device comprises a stack structure, a staircase structure, composite pad structures, and conductive contact structures. The stack structure comprises vertically alternating conductive structures and insulative structures arranged in tiers. Each of the tiers individually comprises one of the conductive structures and one of the insulative structures. The staircase structure has steps comprising edges of at least some of the tiers of the stack structure. The composite pad structures are on the steps of the staircase structure. Each of the composite pad structures comprises a lower pad structure, and an upper pad structure overlying the lower pad structure and having a different material composition than the lower pad structure. The conductive contact structures extend through the composite pad structures and to the conductive structures of the stack structure.

Furthermore, in accordance with embodiments of the disclosure, a method of forming a microelectronic device comprises forming a microelectronic device structure comprising a stack structure comprising a vertically alternating sequence of insulative material and sacrificial material arranged in tiers, and a staircase structure having steps comprising edges of at least some of the tiers of the stack structure. A first liner material is formed on the steps of the staircase structure. A second liner material is formed over the first liner material. Portions of the first liner material and the second liner material horizontally adjacent vertically extending surfaces of the steps of the staircase structure are removed to form discrete composite pad structures on the steps of the staircase structure. The sacrificial material of the tiers of the stack structure is at least partially replaced with conductive material. Conductive contact structures are formed to vertically extend through the discrete composite pad structures and to portions of the conductive material at the steps of the staircase structure.

Figure 2:
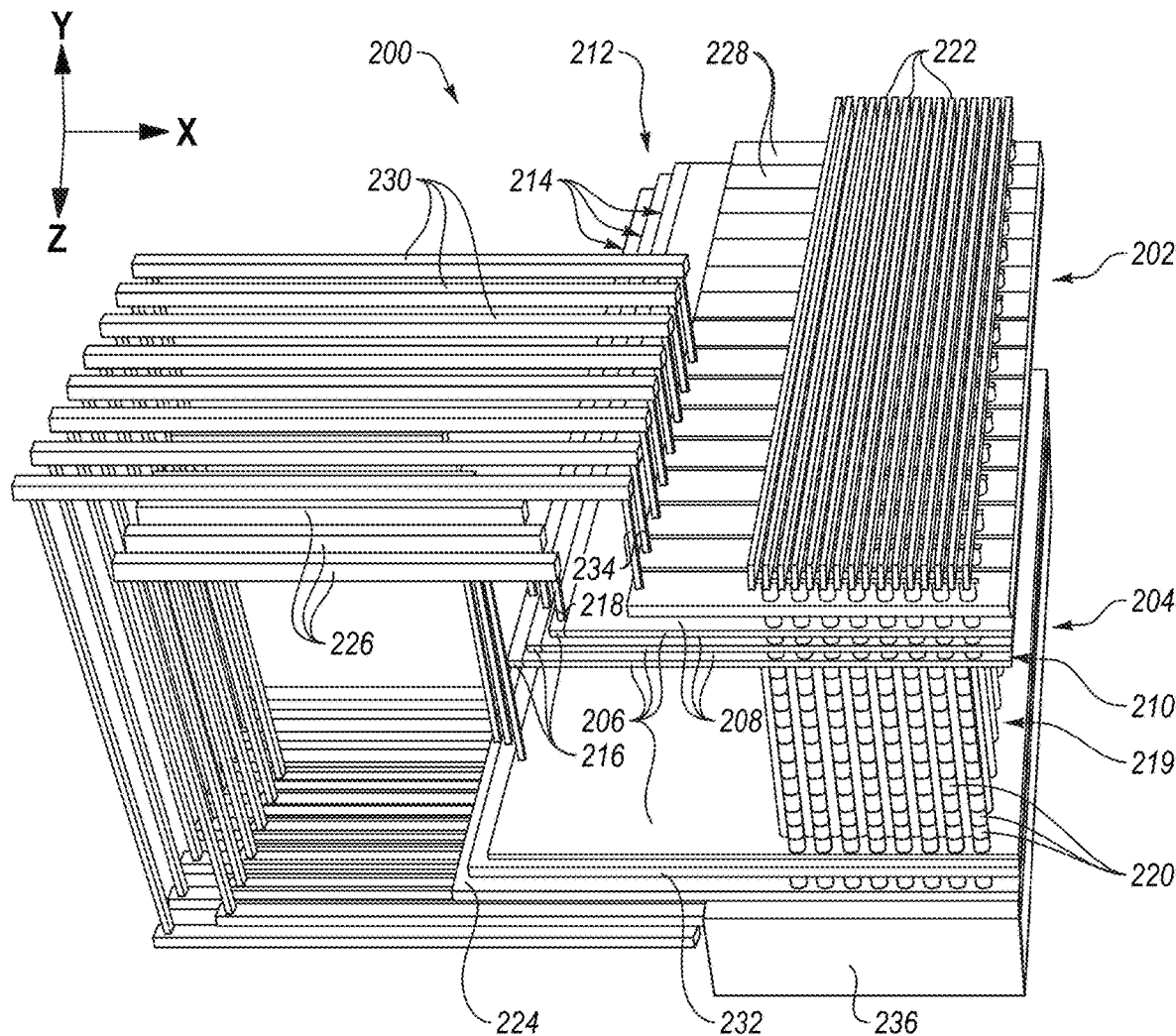
FIG. 2 is a partial cutaway perspective view of a microelectronic device, in accordance with embodiments of the disclosure.

Microelectronic device structures (e.g., the microelectronic device structure 100 previously described with reference to FIG. 1J) of the disclosure may be included in microelectronic devices of the disclosure. For example, FIG. 2 illustrates a partial cutaway perspective view of a portion of a microelectronic device 200 (e.g., a memory device, such as a 3D NAND Flash memory device) including a microelectronic device structure 202. The microelectronic device structure 202 may be substantially similar to the microelectronic device structure 100 at the processing stage previously described with reference to FIG. 1J. In some embodiments, the microelectronic device structure 202 is formed through the processes previously described with reference to FIGS. 1A through 1J.

As shown in FIG. 2, the microelectronic device structure 202 may include a stack structure 204 including a vertically alternating (e.g., in the Z-direction) sequence of conductive structures 206 and insulative structures 208 arranged in tiers 210; a staircase structure 212 having steps 214 defined by edges (e.g., horizontal ends in the X-direction) of the tiers 210; composite pad structures 216 on portions of the tiers 210 of the stack structure 204 at the steps 214 of the staircase structure 212; and contact structures 218 extending through the composite pad structures 216 and contacting (e.g., physically contacting, electrically contacting) to the conductive structures 206 of the tiers 210 of the stack structure 204 at the steps 214 of the staircase structure 212. The stack structure 204, the conductive structures 206, the insulative structures 208, the tiers 210, the staircase structure 212, the steps 214, the composite pad structures 216, and the contact structures 218 may respectively be substantially similar to the stack structure 138, the conductive structures 140, the insulative structures 141, the tiers 142, the staircase structure 110, the steps 112, the composite pad structures 135, and the contact structures 148 previously described with reference to FIG. 1J. The microelectronic device 200 also includes additional features (e.g., structures, devices) operatively associated with the microelectronic device structure 202, as described in further detail below.

The microelectronic device 200 may further include vertical strings 219 of memory cells 220 coupled to each other in series, digit line structures 222 (e.g., bit line structures), a source structure 224, access line routing structures 226, first select gates 228 (e.g., upper select gates, drain select gates (SGDs)), select line routing structures 230, second select gates 232 (e.g., lower select gates, source select gates (SGSs)), and additional contact structures 234. The vertical strings 219 of memory cells 220 extend vertically and orthogonal to conductive lines and tiers (e.g., the digit line structures 222, the source structure 224, the tiers 210 of the stack structure 204, the access line routing structures 226, the first select gates 228, the select line routing structures 230, the second select gates 232). In some embodiments, the memory cells 220 comprise so-called "MONOS" (metal-oxide-nitride-oxide-semiconductor) memory cells. In additional embodiments, the memory cells 220 comprise so-called "TANOS" (tantalum nitride-aluminum oxide-nitride-oxide-semiconductor) memory cells, or so-called "BETANOS" (band/barrier engineered TANOS) memory cells, each of which are subsets of MONOS memory cells. In further embodiments, the memory cells 220 comprise so-called "floating gate" memory cells. The conductive contact structures 218 and the additional contact structures 234 may electrically couple components to each other as shown (e.g., the select line routing structures 230 to the first select gates 228, the access line routing structures 226 to the tiers 210 of the stack structure 204 of the microelectronic device structure 202).

The microelectronic device 200 may also include a base structure 236 positioned vertically below the vertical strings 219 of memory cells 220. The base structure 236 may include at least one control logic region including control logic devices configured to control various operations of other features (e.g., the vertical strings 219 of memory cells 220) of the microelectronic device 200. As a non-limiting example, the control logic region of the base structure 236 may further include one or more (e.g., each) of charge pumps (e.g., $V_{CCP}$ charge pumps, $V_{NEGWL}$ charge pumps, DVC2 charge pumps), delay-locked loop (DLL) circuitry (e.g., ring oscillators), $V_{dd}$ regulators, drivers (e.g., string drivers), page buffers, decoders (e.g., local deck decoders, column decoders, row decoders), sense amplifiers (e.g., equalization (EQ) amplifiers, isolation (ISO) amplifiers, NMOS sense amplifiers (NSAs), PMOS sense amplifiers (PSAs)), repair circuitry (e.g., column repair circuitry, row repair circuitry), I/O devices (e.g., local I/O devices), memory test devices, MUX, error checking and correction (ECC) devices, self-refresh/wear leveling devices, and other chip/deck control circuitry. The control logic region of the base structure 236 may be coupled to the source structure 224, the access line routing structures 226, the select line routing structures 230, and the digit line structures 222. In some embodiments, the control logic region of the base structure 236 includes CMOS (complementary metal-oxide-semiconductor) circuitry. In such embodiments, the control logic region of the base structure 236 may be characterized as having a "CMOS under Array" ("CuA") configuration.

Thus, in accordance with embodiments of the disclosure, a memory device comprises a stack structure, a staircase structure, composite pad structures, conductive contact structures, digit line structures, a source structure, an array of vertically extending strings of memory cells, access line routing structures, and a control logic circuitry. The stack structure comprises vertically alternating conductive structures and insulative structures arranged in tiers. Each of the tiers individually comprises at least one of the conductive structures and at least one of the insulative structures. The staircase structure has steps comprising edges of at least some of the tiers of the stack structure. The composite pad structures are on the steps of the staircase structure. Each of the composite pad structures comprises a lower pad structure on one of the steps of the staircase structure, and an upper pad structure over the lower pad structure and having a different material composition and larger horizontal dimensions than the lower pad structure. The conductive contact structures vertically extend through the composite pad structures and to portions of at least some of the conductive structures of the stack structure at the steps of the staircase structure. The digit line structures overlie the stack structure. The source structure underlies the stack structure. The vertically extending strings of memory cells extend through the stack structure and are coupled to the source structure and the digit line structures. The access line routing structures are coupled to the conductive contact structures. The control logic circuitry vertically underlies the source structure and is within horizontal boundaries of the array of vertically extending strings of memory cells. The control logic circuitry is electrically coupled to the source structure, the digit line structures, and the access line routing structures.

Figure 3:
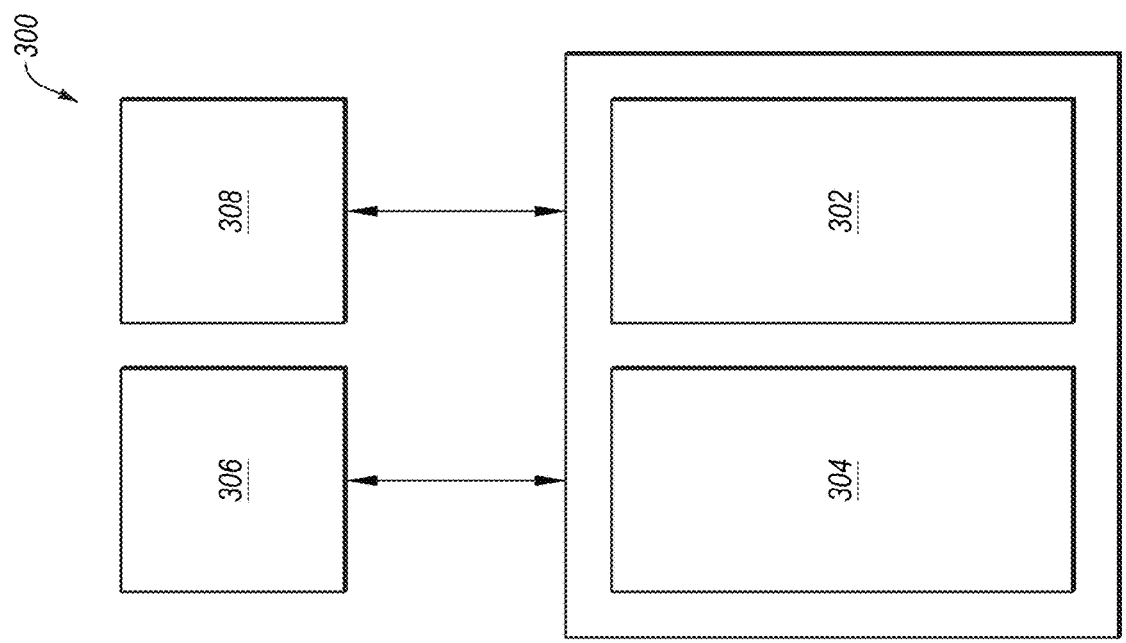
FIG. 3 is a schematic block diagram illustrating an electronic system, in accordance with embodiments of the disclosure.

Microelectronic device structures (e.g., the microelectronic device structure 100 previously described with reference to FIG. 1J) and microelectronic devices (e.g., the microelectronic device 200 previously described with reference to FIG. 2) in accordance with embodiments of the disclosure may be used in embodiments of electronic systems of the disclosure. For example, FIG. 3 is a block diagram of an illustrative electronic system 300 according to embodiments of disclosure. The electronic system 300 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPAD® or SURFACE® tablet, an electronic book, a navigation device, etc. The electronic system 300 includes at least one memory device 302. The memory device 302 may comprise, for example, an embodiment of one or more of a microelectronic device structure and a microelectronic device previously described herein. The electronic system 300 may further include at least one electronic signal processor device 304 (often referred to as a "microprocessor"). The electronic signal processor device 304 may, optionally, include an embodiment of one or more of a microelectronic device structure and a microelectronic device previously described herein. While the memory device 302 and the electronic signal processor device 304 are depicted as two (2) separate devices in FIG. 3, in additional embodiments, a single (e.g., only one) memory/processor device having the functionalities of the memory device 302 and the electronic signal processor device 304 is included in the electronic system 300. In such embodiments, the memory/processor device may include one or more of a microelectronic device structure and a microelectronic device previously described herein. The electronic system 300 may further include one or more input devices 306 for inputting information into the electronic system 300 by a user, such as, for example, a mouse or other pointing device, a keyboard, a touchpad, a button, or a control panel. The electronic system 300 may further include one or more output devices 308 for outputting information (e.g., visual or audio output) to a user such as, for example, one or more of a monitor, a display, a printer, an audio output jack, and a speaker. In some embodiments, the input device 306 and the output device 308 may comprise a single touchscreen device that can be used both to input information to the electronic system 300 and to output visual information to a user. The input device 306 and the output device 308 may communicate electrically with one or more of the memory device 302 and the electronic signal processor device 304.

Thus, in accordance with embodiments of the disclosure, an electronic system comprises an input device, an output device, a processor device operably coupled to the input device and the output device, and a memory device operably coupled to the processor device. The memory device comprises a microelectronic device structure comprising a stack structure, a staircase structure, discrete pad structures, and conductive contact structures. The stack structure comprises tiers each comprising a conductive structure, and an insulative structure vertically neighboring the conductive structure. The staircase structure is within the stack structure and has steps comprising edges of at least some of the tiers. The discrete pad structures are on at least some of the steps of the staircase structure. The discrete pad structures individually comprise a first material, and a second material over the first material. The second material has a different material composition than the first material and a larger horizontal area than the first material. The conductive contact structures extend through the discrete pad structures and to at least some of the steps of the staircase structure.

The methods, structures (e.g., the microelectronic device structure 100), devices (e.g., the microelectronic device 200), and systems (e.g., the electronic system 300) of the disclosure advantageously facilitate one or more of improved performance, reliability, and durability, lower costs, increased miniaturization of components, improved pattern quality, and greater packaging density as compared to conventional structures, conventional devices, and conventional systems. The methods and structures of the disclosure may alleviate problems related to the formation and processing of conventional microelectronic devices including stack structures having staircase structures at edges thereof. For example, the methods and structures of the disclosure may reduce the risk of undesirable damage (e.g., contact structure punch through) to conductive structures (e.g., the conductive structures 140) of stack structures (e.g., the stack structure 138) at steps (e.g., the steps 112) of staircase structures (e.g., the staircase structure 110), as well as undesirable current leakage and short circuits as compared to conventional methods and conventional structures.

While the disclosure is susceptible to various modifications and alternative forms, specific embodiments have been shown by way of example in the drawings and have been described in detail herein. However, the disclosure is not limited to the particular forms disclosed. Rather, the disclosure is to cover all modifications, equivalents, and alternatives falling within the scope of the following appended claims and their legal equivalents.

What is claimed is:

1. A microelectronic device, comprising:
   a stack structure comprising vertically alternating conductive structures and insulative structures arranged in tiers, each of the tiers individually comprising one of the conductive structures and one of the insulative structures;
   a staircase structure having steps comprising edges of at least some of the tiers of the stack structure;
   composite pad structures on the steps of the staircase structure and in direct physical contact with the insulative structures of the tiers of the stack structure at the steps of the staircase structure, each of the composite pad structures comprising:
   a lower pad structure comprising conductive material; and
   an upper pad structure overlying all portions of the lower pad structure and at a same step of the staircase structure as the lower pad structure, the upper pad structure having a different material composition than the lower pad structure and having a larger horizontal dimension than the lower pad structure; and conductive contact structures extending through the composite pad structures and the insulative structures of at least some of the tiers of the stack structure at the steps of the staircase structure, and to the conductive structures of the stack structure.

2. The microelectronic device of claim 1, wherein:
the conductive material of the lower pad structure of at least one of the composite pad structures comprises metal atoms; and
the upper pad structure of the at least one of the composite pad structures comprises a doped semiconductive material.

3. The microelectronic device of claim 2, wherein:
the conductive material of the lower pad structure of at least one of the composite pad structures comprises one or more of at least one metal, at least one alloy, at least one metal nitride, at least one metal silicide, at least one metal carbide, and at least one metal oxide; and
the doped semiconductive material of the upper pad structure of the at least one of the composite pad structures comprises polycrystalline silicon doped with one or more of C, B, P, Ar, Sb, Bi, Al, Ga, N, O, F, Cl, Br, H, $^2$H, He, Ne, and Ar.

4. The microelectronic device of claim 1, wherein the upper pad structure of at least one of the composite pad structures comprises a dielectric material doped with one or more of C and B.

5. The microelectronic device of claim 1, wherein:
a thickness of the lower pad structure of at least one of the composite pad structures is within a range of from about 5 nm to about 1000 nm; and
an additional thickness of the upper pad structure of the at least one of the composite pad structures is within a range of from about 5 nm to about 100 nm.

6. The microelectronic device of claim 1, wherein the upper pad structure of at least one of the composite pad structures horizontally extends past horizontal boundaries of at least one of the steps of the staircase structure directly vertically under the at least one of the composite pad structures.

7. The microelectronic device of claim 1, wherein the upper pad structure of at least one of the composite pad structures has one or more greater horizontal dimensions than the lower pad structure of the at least one of the composite pad structures.

8. The microelectronic device of claim 1, wherein a horizontal center of at least one of the composite pad structures is offset from a horizontal center of at least one of the steps of the staircase structure directly vertically under the at least one of the composite pad structures.

9. A method of forming a microelectronic device, comprising:
forming a microelectronic device structure, the microelectronic device structure comprising:
a stack structure comprising a vertically alternating sequence of insulative material and sacrificial material arranged in tiers; and
a staircase structure having steps comprising edges of at least some of the tiers of the stack structure;
forming a first liner material on the steps of the staircase structure;
forming a second liner material over the first liner material;

removing portions of the first liner material and the second liner material horizontally adjacent vertically extending surfaces of the steps of the staircase structure to form discrete composite pad structures on the steps of the staircase structure and in direct physical contact with the insulative material of the tiers of the stack structure at the steps of the staircase structure, each of the discrete composite pad structures comprising:
a lower pad structure comprising conductive material; and
an upper pad structure overlying all portions of the lower pad structure and at a same step of the staircase structure as the lower pad structure, the upper pad structure having a different material composition than the lower pad structure and having a larger horizontal dimension than the lower pad structure;
at least partially replacing the sacrificial material of the tiers of the stack structure with conductive material; and
forming conductive contact structures vertically extending through the discrete composite pad structures and the insulative material of at least some of the tiers of the stack structure at the steps of the staircase structure, and to portions of the conductive material at the steps of the staircase structure.

10. The method of claim 9, wherein:
forming the first liner material on the steps of the staircase structure comprises conformally forming a metal-containing material on the steps of the staircase structure; and
forming the second liner material over the first liner material comprises conformally forming one or more of a semiconductive material and a dielectric material over the first liner material.

11. The method of claim 10, wherein conformally forming one or more of the semiconductive material and the dielectric material over the first liner material comprises conformally forming one or more of polycrystalline silicon, a dielectric oxide material, and a dielectric nitride material over the first liner material.

12. The method of claim 9, further comprising forming a dielectric liner material on the first liner material prior to forming the second liner material.

13. The method of claim 9, wherein removing portions of the first liner material and the second liner material comprises:
doping the second liner material with at least one chemical species to form a doped second liner material, horizontally extending portions of the doped second liner material having greater amounts of the at least one chemical species than vertically extending portions of the doped second liner material;
removing the vertically extending portions of the doped second liner material relative to the horizontally extending portions of the doped second liner material; and
removing vertically extending portions of the first liner material after removing the vertically extending portions of the doped second liner material.

14. The method of claim 13, wherein doping the second liner material with the at least one chemical species comprises doping the second liner material with one or more of C, B, P, Ar, Sb, Bi, Al, Ga, N, O, F, Cl, Br, H, $^2$H, He, Ne, and Ar.

15. The method of claim 13, wherein removing the vertically extending portions of the doped second liner material relative to the horizontally extending portions of the doped second liner material comprises treating the doped second liner material with at least one etchant that removes the vertically extending portions of the doped second liner material faster than horizontally extending portions of the doped second liner material.

16. The method of claim 13, wherein removing vertically extending portions of the first liner material comprises substantially removing the vertically extending portions to expose the vertically extending surfaces of the steps of the staircase structure.

17. The method of claim 9, further comprising forming a dielectric material having a different material composition than the sacrificial material over and around the discrete composite pad structures and the steps of staircase structure prior to at least partially replacing the sacrificial material of the tiers of the stack structure with the conductive material.

18. The method of claim 17, wherein forming conductive contact structures comprises:
  forming initial contact openings vertically extending through the dielectric material and to the discrete composite pad structures;
  extending the initial contact openings through composite pad structures and to the portions of the conductive material at the steps of the staircase structure to form contact openings; and
  filling the contact openings with additional conductive material to form the conductive contact structures.

19. The method of claim 9, further comprising forming a portion of each of the discrete composite pad structures to horizontally extend past a horizontal boundary of one of the steps of the staircase structure vertically neighboring and underlying the portion.

20. A memory device, comprising:
  a stack structure comprising vertically alternating conductive structures and insulative structures arranged in tiers, each of the tiers individually comprising at least one of the conductive structures and at least one of the insulative structures;
  a staircase structure having steps comprising edges of at least some of the tiers of the stack structure;
  composite pad structures on the steps of the staircase structure and in direct physical contact with the insulative structures of the tiers of the stack structure at the steps of the staircase structure, each of the composite pad structures comprising:
    a lower pad structure on one of the steps of the staircase structure, the lower pad structure comprising conductive material; and
    an upper pad structure over the lower pad structure and at a same step of the staircase structure, the upper pad structure having a different material composition than that lower pad structure and having a larger horizontal dimension than the lower pad structure, at least one of horizontal ends of a relatively vertically higher upper pad structure substantially aligned with at least one of horizontal end of a relatively vertically lower upper pad structure horizontally neighboring the relatively vertically higher upper pad structure;
  conductive contact structures vertically extending through the composite pad structures and to portions of at least some of the conductive structures of the stack structure at the steps of the staircase structure;
  digit line structures overlying the stack structure;
  a source structure underlying the stack structure;
  an array of vertically extending strings of memory cells extending through the stack structure and coupled to the source structure and the digit line structures;
  access line routing structures coupled to the conductive contact structures; and
  a control logic circuitry vertically underlying the source structure and within horizontal boundaries of the array of vertically extending strings of memory cells, the control logic circuitry coupled to the source structure, the digit line structures, and the access line routing structures.

21. The memory device of claim 20, wherein, for at least one of the composite pad structures:
  the lower pad structure comprises at least one metal; and
  the upper pad structure comprises polycrystalline silicon doped with one or more of C and B.

22. The memory device of claim 20, wherein, for at least one of the composite pad structures:
  the lower pad structure comprises at least one metal; and
  the upper pad structure comprises at least one doped dielectric material.

23. The memory device of claim 20, at least one of the composite pad structures further comprises a dielectric pad structure vertically interposed between the lower pad structure and the upper pad structure.

24. The memory device of claim 20, wherein, for at least one of the composite pad structures:
  first horizontal boundaries of the lower pad structure and the upper pad structure in a first horizontal direction are substantially align with one another; and
  second horizontal boundaries of the lower pad structure and the upper pad structure in the first horizontal direction are horizontally offset from one another.

25. An electronic system, comprising:
  an input device;
  an output device;
  a processor device operably coupled to the input device and the output device; and
  a memory device operably coupled to the processor device and comprising at least one microelectronic device structure comprising:
    a stack structure comprising tiers each comprising:
    a conductive structure; and
    an insulative structure vertically neighboring the conductive structure;
    a staircase structure within the stack structure and having steps comprising edges of at least some of the tiers;
  discrete pad structures on at least some of the steps of the staircase structure and in direct physical contact with the insulative structures of the tiers of the stack structure at the steps of the staircase structure, each of the discrete pad structures comprising:
    a first material comprising conductive material; and
    a second material over the first material and same step of the staircase structure, the second material having a different material composition than the first material and having a larger horizontal area than the first material, at least one of horizontal ends of a relatively vertically higher second material substantially aligned with at least one of horizontal end of a relatively vertically lower second material horizontally neighboring the relatively vertically higher second material; and
  conductive contact structures extending through the discrete pad structures and to at least some of the steps of the staircase structure.

* * * * *

UNITED STATES PATENT AND TRADEMARK OFFICE
CERTIFICATE OF CORRECTION

PATENT NO. : 12,255,143 B2
APPLICATION NO. : 17/187481
DATED : March 18, 2025
INVENTOR(S) : Alyssa N. Scarbrough, Jordan D. Greenlee and John D. Hopkins Page 1 of 1

It is certified that error appears in the above-identified patent and that said Letters Patent is hereby corrected as shown below:

In the Specification

Column 12, Line 46, change "about $1.0 \times 10$ W dopant atoms/cm$^3$." to --about $1.0 \times 10^{25}$ dopant atoms/cm$^3$.--

Signed and Sealed this
Sixth Day of May, 2025

Coke Morgan Stewart
*Acting Director of the United States Patent and Trademark Office*